United States Patent
Zope et al.

(10) Patent No.: US 12,354,877 B2
(45) Date of Patent: Jul. 8, 2025

(54) VAPOR DEPOSITION OF FILMS COMPRISING MOLYBDENUM

(71) Applicant: ASM IP HOLDING B.V., Almere (NL)

(72) Inventors: Bhushan Zope, Phoenix, AZ (US); Eric Christopher Stevens, Tempe, AZ (US); Shankar Swaminathan, Phoenix, AZ (US); Eric James Shero, Phoenix, AZ (US); Robert Brennan Milligan, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 432 days.

(21) Appl. No.: 17/353,262

(22) Filed: Jun. 21, 2021

(65) Prior Publication Data
US 2021/0407809 A1 Dec. 30, 2021

Related U.S. Application Data

(60) Provisional application No. 63/043,271, filed on Jun. 24, 2020.

(51) Int. Cl.
*H01L 21/285* (2006.01)
*C23C 16/08* (2006.01)
(Continued)

(52) U.S. Cl.
CPC ........ *H01L 21/28568* (2013.01); *C23C 16/08* (2013.01); *C23C 16/45553* (2013.01); *H01L 21/28556* (2013.01); *H01L 21/76843* (2013.01)

(58) Field of Classification Search
CPC ......... H01L 21/28568; H01L 21/28556; H01L 21/76843; H01L 23/53209;
(Continued)

(56) References Cited

U.S. PATENT DOCUMENTS

| | | |
|---|---|---|
| 3,429,903 A | 2/1969 | Larson |
| 3,708,728 A | 1/1973 | Sterling et al. |

(Continued)

FOREIGN PATENT DOCUMENTS

| | | |
|---|---|---|
| CN | 101117308 | 2/2008 |
| CN | 101343732 | 1/2009 |

(Continued)

OTHER PUBLICATIONS

Aaltonen et al., "ALD of Rhodium Thin Films from Rh (acac)$_3$ and Oxygen," Electrochem. Solid-State Lett. 8 (8): C99-C101 (2005).
(Continued)

*Primary Examiner* — Benjamin P Sandvik
*Assistant Examiner* — John Patrick Cornely
(74) *Attorney, Agent, or Firm* — Snell & Wilmer L.L.P.

(57) ABSTRACT

Vapor deposition processes for forming thin films comprising molybdenum on a substrate are provide. In some embodiments the processes comprise a plurality of deposition cycles in which the substrate is separately contacted with a vapor phase molybdenum precursor comprising a molybdenum halide, a first reactant comprising CO, and a second reactant comprising $H_2$. In some embodiments the thin film comprises MoC, $Mo_2C$, or MoOC. In some embodiments the substrate is additionally contacted with a nitrogen reactant and a thin film comprising molybdenum, carbon and nitrogen is deposited, such as MoCN or MoOCN.

24 Claims, 4 Drawing Sheets

(51) Int. Cl.
*C23C 16/455* (2006.01)
*H01L 21/768* (2006.01)

(58) Field of Classification Search
CPC ......... H01L 21/28562; H01L 21/32051; H01L 21/285; H01L 21/28088; C23C 16/08; C23C 16/45553; C23C 16/308; C23C 16/32; C23C 16/45523; C23C 16/45527; C23C 28/32; C23C 28/34; C23C 16/14; C23C 16/30; C23C 16/36; C23C 16/45531

See application file for complete search history.

(56) References Cited

U.S. PATENT DOCUMENTS

| | | |
|---|---|---|
| 3,784,631 A | 1/1974 | Menapace et al. |
| 4,058,430 A | 11/1977 | Suntola et al. |
| 4,210,608 A | 7/1980 | Pinke |
| 4,477,296 A | 10/1984 | Nair |
| 4,565,747 A | 1/1986 | Nakae et al. |
| 4,604,118 A | 8/1986 | Bocko et al. |
| 4,670,110 A | 6/1987 | Withers et al. |
| 4,860,687 A | 8/1989 | Frijlink |
| 4,891,050 A | 1/1990 | Bowers et al. |
| 4,902,551 A | 2/1990 | Nakaso et al. |
| 4,935,661 A | 6/1990 | Heinecke et al. |
| 4,965,656 A | 10/1990 | Koubuchi et al. |
| 5,028,724 A | 7/1991 | Ivankovits et al. |
| 5,106,454 A | 4/1992 | Allardyce et al. |
| 5,281,274 A | 1/1994 | Yoder |
| 5,306,666 A | 4/1994 | Izumi |
| 5,316,793 A | 5/1994 | Wallace et al. |
| 5,342,652 A | 8/1994 | Foster et al. |
| 5,382,333 A | 1/1995 | Ando et al. |
| 5,391,517 A | 2/1995 | Gelatos et al. |
| 5,438,028 A | 8/1995 | Weissman et al. |
| 5,453,494 A | 9/1995 | Kirlin et al. |
| 5,595,784 A | 1/1997 | Kaim et al. |
| 5,603,771 A | 2/1997 | Seiberras et al. |
| 5,637,533 A | 6/1997 | Choi |
| 5,691,235 A | 11/1997 | Meikle et al. |
| 5,695,810 A | 12/1997 | Dubin et al. |
| 5,711,811 A | 1/1998 | Suntola et al. |
| 5,723,384 A | 3/1998 | Park et al. |
| 5,731,634 A | 3/1998 | Matsuo et al. |
| 5,744,254 A | 4/1998 | Kampe et al. |
| 5,789,024 A | 8/1998 | Levy et al. |
| 5,820,664 A | 10/1998 | Gardiner et al. |
| 5,820,965 A | 10/1998 | Pyzik et al. |
| 5,865,365 A | 2/1999 | Nishikawa et al. |
| 5,874,600 A | 2/1999 | Rautenstrauch et al. |
| 5,884,009 A | 3/1999 | Okase |
| 5,915,004 A | 6/1999 | Pabbati et al. |
| 5,916,365 A | 6/1999 | Sherman |
| 5,923,056 A | 7/1999 | Lee et al. |
| 5,939,334 A | 8/1999 | Nguyen et al. |
| 5,946,598 A | 8/1999 | Yeh |
| 5,947,710 A | 9/1999 | Cooper et al. |
| 5,964,943 A | 10/1999 | Stein et al. |
| 5,972,430 A | 10/1999 | DiMeo, Jr. et al. |
| 5,989,672 A | 11/1999 | Hayashi |
| 5,998,048 A | 12/1999 | Jin et al. |
| 6,006,763 A | 12/1999 | Mori et al. |
| 6,015,590 A | 1/2000 | Suntola et al. |
| 6,015,986 A | 1/2000 | Schuegraf |
| 6,033,584 A | 3/2000 | Ngo et al. |
| 6,040,243 A | 3/2000 | Li et al. |
| 6,063,705 A | 5/2000 | Vaartstra |
| 6,066,892 A | 5/2000 | Ding et al. |
| 6,074,945 A | 6/2000 | Vaartstra et al. |
| 6,087,257 A | 6/2000 | Park et al. |
| 6,099,904 A | 8/2000 | Mak et al. |
| 6,108,937 A | 8/2000 | Raaijmakers |
| 6,110,529 A | 8/2000 | Gardiner et al. |
| 6,124,158 A | 9/2000 | Dautartas et al. |
| 6,124,189 A | 9/2000 | Watanabe et al. |
| 6,126,996 A | 10/2000 | Kirlin et al. |
| 6,130,123 A | 10/2000 | Liang et al. |
| 6,133,159 A | 10/2000 | Vaartstra et al. |
| 6,136,163 A | 10/2000 | Cheung et al. |
| 6,139,624 A | 10/2000 | Rupp |
| 6,139,700 A | 10/2000 | Kang et al. |
| 6,143,658 A | 11/2000 | Donnelly, Jr. et al. |
| 6,144,060 A | 11/2000 | Park et al. |
| 6,156,382 A | 12/2000 | Rajagopalan et al. |
| 6,162,501 A | 12/2000 | Kim |
| 6,171,910 B1 | 1/2001 | Hobbs et al. |
| 6,174,809 B1 | 1/2001 | Kang et al. |
| 6,194,310 B1 | 2/2001 | Hsu et al. |
| 6,200,893 B1 | 3/2001 | Snef |
| 6,203,613 B1 | 3/2001 | Gates et al. |
| 6,206,967 B1 | 3/2001 | Mak et al. |
| 6,258,157 B1 | 7/2001 | Gordon |
| 6,268,291 B1 | 7/2001 | Andricacos et al. |
| 6,270,572 B1 | 8/2001 | Kim et al. |
| 6,281,125 B1 | 8/2001 | Vaartstra et al. |
| 6,287,965 B1 | 9/2001 | Kang et al. |
| 6,294,467 B1 | 9/2001 | Yokoyama et al. |
| 6,297,539 B1 | 10/2001 | Ma et al. |
| 6,303,500 B1 | 10/2001 | Jiang et al. |
| 6,305,314 B1 | 10/2001 | Sneh et al. |
| 6,306,756 B1 | 10/2001 | Hasunuma et al. |
| 6,320,213 B1 | 11/2001 | Kirlin et al. |
| 6,323,131 B1 | 11/2001 | Obeng et al. |
| 6,335,280 B1 | 1/2002 | Van der Jeugd |
| 6,342,277 B1 | 1/2002 | Sherman |
| 6,346,151 B1 | 2/2002 | Jiang et al. |
| 6,359,159 B1 | 3/2002 | Welch |
| 6,380,080 B2 | 4/2002 | Visokay |
| 6,380,627 B1 | 4/2002 | Weihs et al. |
| 6,391,785 B1 | 5/2002 | Satta et al. |
| 6,395,650 B1 | 5/2002 | Callegari et al. |
| 6,403,414 B2 | 6/2002 | Marsh |
| 6,404,191 B2 | 6/2002 | Daughton et al. |
| 6,420,189 B1 | 7/2002 | Lopatin |
| 6,433,432 B2 | 8/2002 | Shimizu |
| 6,444,568 B1 | 9/2002 | Sundararajan et al. |
| 6,444,868 B1 | 9/2002 | Vaughn et al. |
| 6,455,424 B1 | 9/2002 | McTeer et al. |
| 6,464,779 B1 | 10/2002 | Powell et al. |
| 6,475,276 B1 | 11/2002 | Elers et al. |
| 6,478,931 B1 | 11/2002 | Wadley et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,541,067 B1 | 4/2003 | Marsh et al. |
| 6,541,842 B2 | 4/2003 | Meynen et al. |
| 6,551,399 B1 | 4/2003 | Shen et al. |
| 6,576,053 B1 | 6/2003 | Kim et al. |
| 6,586,330 B1 | 7/2003 | Ludviksson et al. |
| 6,593,656 B2 | 7/2003 | Ahn et al. |
| 6,599,572 B2 | 7/2003 | Saanila et al. |
| 6,613,383 B1 | 9/2003 | George et al. |
| 6,617,173 B1 | 9/2003 | Shen |
| 6,632,279 B1 | 10/2003 | Ritala et al. |
| 6,649,091 B2 | 11/2003 | Ryan et al. |
| 6,656,748 B2 | 12/2003 | Hall et al. |
| 6,664,192 B2 | 12/2003 | Satta et al. |
| 6,679,951 B2 | 1/2004 | Soininen et al. |
| 6,680,540 B2 | 1/2004 | Nakano et al. |
| 6,703,708 B2 | 3/2004 | Werkhoven et al. |
| 6,713,381 B2 | 3/2004 | Barr et al. |
| 6,720,262 B2 | 4/2004 | Koh et al. |
| 6,759,325 B2 | 7/2004 | Raaijmakers et al. |
| 6,777,331 B2 | 8/2004 | Nguyen |
| 6,784,101 B1 | 8/2004 | Yu et al. |
| 6,784,504 B2 | 8/2004 | Derderian et al. |
| 6,794,287 B2 | 9/2004 | Saanila et al. |
| 6,800,542 B2 | 10/2004 | Kim |
| 6,800,567 B2 | 10/2004 | Cho et al. |
| 6,824,816 B2 | 11/2004 | Aaltonen et al. |

(56) References Cited

U.S. PATENT DOCUMENTS

| | | |
|---|---|---|
| 6,842,740 B1 | 1/2005 | Jeran et al. |
| 6,849,122 B1 | 2/2005 | Fair |
| 6,852,635 B2 | 2/2005 | Satta et al. |
| 6,878,628 B2 | 4/2005 | Sophie et al. |
| 6,881,260 B2 | 4/2005 | Marsh et al. |
| 6,881,437 B2 | 4/2005 | Ivanov et al. |
| 6,887,795 B2 | 5/2005 | Soininen et al. |
| 6,921,712 B2 | 7/2005 | Soininen et al. |
| 6,933,225 B2 | 8/2005 | Werkhoven et al. |
| 6,936,535 B2 | 8/2005 | Kim et al. |
| 6,943,073 B2 | 9/2005 | Marsh et al. |
| 6,955,986 B2 | 10/2005 | Li |
| 6,984,591 B1 | 1/2006 | Buchanan et al. |
| 7,011,981 B2 | 3/2006 | Kim et al. |
| 7,067,407 B2 | 6/2006 | Kostamo et al. |
| 7,105,054 B2 | 9/2006 | Lindfors |
| 7,107,998 B2 | 9/2006 | Greer et al. |
| 7,118,779 B2 | 10/2006 | Verghese et al. |
| 7,135,207 B2 | 11/2006 | Min et al. |
| 7,183,604 B2 | 2/2007 | Cartier |
| 7,211,509 B1 | 5/2007 | Gopinath et al. |
| 7,220,451 B2 | 5/2007 | Aaltonen et al. |
| 7,220,669 B2 | 5/2007 | Hujanen et al. |
| 7,241,677 B2 | 7/2007 | Soinenen et al. |
| 7,256,144 B2 | 8/2007 | Koyanagi et al. |
| 7,273,526 B2 | 9/2007 | Shinriki et al. |
| 7,273,814 B2 | 9/2007 | Matsuda |
| 7,300,873 B2 | 11/2007 | Millward |
| 7,323,581 B1 | 1/2008 | Gardiner et al. |
| 7,404,985 B2 | 7/2008 | Chang et al. |
| 7,410,666 B2 | 8/2008 | Elers et al. |
| 7,419,903 B2 | 9/2008 | Haukka et al. |
| 7,435,484 B2 | 10/2008 | Shinriki et al. |
| 7,438,949 B2 | 10/2008 | Weidman |
| 7,476,618 B2 | 1/2009 | Kilpela et al. |
| 7,494,927 B2 | 2/2009 | Kostamo et al. |
| 7,524,766 B2 | 4/2009 | Itatani et al. |
| 7,541,284 B2 | 6/2009 | Park |
| 7,601,223 B2 | 10/2009 | Lindfors et al. |
| 7,615,480 B2 | 11/2009 | Boyd |
| 7,655,564 B2 | 1/2010 | Shinriki |
| 7,666,773 B2 | 2/2010 | Huotari et al. |
| 7,749,871 B2 | 7/2010 | Elers et al. |
| 7,968,437 B2 | 6/2011 | Itatani et al. |
| 8,142,847 B2 | 3/2012 | Shenai-Khatkhate et al. |
| 8,188,464 B2 | 5/2012 | Quick |
| 8,268,409 B2 * | 9/2012 | Elers ........................ C23C 16/32 427/248.1 |
| 8,435,905 B2 | 5/2013 | Horli et al. |
| 9,536,734 B2 | 1/2017 | Hanashima et al. |
| 9,587,307 B2 | 3/2017 | Haukka et al. |
| 9,802,220 B2 | 10/2017 | Heys et al. |
| 9,911,590 B2 | 3/2018 | Dussarrat et al. |
| 10,131,984 B2 | 11/2018 | Okada |
| 10,358,407 B2 | 7/2019 | Hatanpaa et al. |
| 11,295,980 B2 | 4/2022 | Zope et al. |
| 11,761,081 B2 | 9/2023 | Wright, Jr. et al. |
| 2001/0003064 A1 | 6/2001 | Ohto |
| 2001/0013617 A1 | 8/2001 | Toyoda et al. |
| 2001/0018266 A1 | 8/2001 | Jiang et al. |
| 2001/0030366 A1 | 10/2001 | Nakano et al. |
| 2001/0034097 A1 | 10/2001 | Lim et al. |
| 2001/0041250 A1 | 11/2001 | Werkhoven et al. |
| 2001/0052318 A1 | 12/2001 | Jiang et al. |
| 2002/0004293 A1 | 1/2002 | Soininen et al. |
| 2002/0006711 A1 | 1/2002 | Yamazaki et al. |
| 2002/0013487 A1 | 1/2002 | Norman et al. |
| 2002/0027286 A1 | 3/2002 | Sundararajan et al. |
| 2002/0064948 A1 | 5/2002 | Saito et al. |
| 2002/0102838 A1 | 8/2002 | Parajpe et al. |
| 2002/0142588 A1 | 10/2002 | Basceri et al. |
| 2002/0146513 A1 | 10/2002 | Jin et al. |
| 2002/0173054 A1 | 11/2002 | Kim |
| 2003/0008072 A1 | 1/2003 | Lee et al. |
| 2003/0013302 A1 | 1/2003 | Nguyen et al. |
| 2003/0032281 A1 | 2/2003 | Werkhoven et al. |
| 2003/0049931 A1 | 3/2003 | Byun et al. |
| 2003/0059535 A1 | 3/2003 | Luo et al. |
| 2003/0072975 A1 | 4/2003 | Shero et al. |
| 2003/0080363 A1 | 5/2003 | Maruyama et al. |
| 2003/0082296 A1 | 5/2003 | Elers et al. |
| 2003/0088116 A1 | 5/2003 | Kawano et al. |
| 2003/0100162 A1 | 5/2003 | Joo |
| 2003/0104126 A1 | 6/2003 | Fang et al. |
| 2003/0121608 A1 | 7/2003 | Chen et al. |
| 2003/0123216 A1 | 7/2003 | Yoon et al. |
| 2003/0127043 A1 | 7/2003 | Lu et al. |
| 2003/0135061 A1 | 7/2003 | Norman et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0165615 A1 | 9/2003 | Aaltonen et al. |
| 2003/0181035 A1 | 9/2003 | Yoon et al. |
| 2003/0194825 A1 | 10/2003 | Law et al. |
| 2003/0203616 A1 | 10/2003 | Chung et al. |
| 2003/0214043 A1 | 11/2003 | Saitoh et al. |
| 2003/0219991 A1 | 11/2003 | Geusic et al. |
| 2003/0233976 A1 | 12/2003 | Marsh et al. |
| 2004/0005753 A1 | 1/2004 | Kostamo et al. |
| 2004/0028952 A1 | 2/2004 | Cartier et al. |
| 2004/0038529 A1 | 2/2004 | Soininen et al. |
| 2004/0041194 A1 | 3/2004 | Marsh |
| 2004/0043557 A1 | 3/2004 | Haukka et al. |
| 2004/0053496 A1 | 3/2004 | Choi |
| 2004/0082125 A1 | 4/2004 | Hou et al. |
| 2004/0087143 A1 | 5/2004 | Norman et al. |
| 2004/0095792 A1 | 5/2004 | Hermann et al. |
| 2004/0105934 A1 | 6/2004 | Chang et al. |
| 2004/0118697 A1 | 6/2004 | Wen et al. |
| 2004/0126944 A1 | 7/2004 | Rontondaro et al. |
| 2004/0142558 A1 | 7/2004 | Granneman |
| 2004/0152255 A1 | 8/2004 | Seidl et al. |
| 2004/0192021 A1 | 9/2004 | Li |
| 2004/0192036 A1 | 9/2004 | Koyanagi et al. |
| 2004/0214354 A1 | 10/2004 | Marsh et al. |
| 2004/0216668 A1 | 11/2004 | Lindfors et al. |
| 2004/0224475 A1 | 11/2004 | Lee et al. |
| 2004/0224504 A1 | 11/2004 | Gadgil |
| 2005/0009325 A1 | 1/2005 | Chung et al. |
| 2005/0020060 A1 | 1/2005 | Aaltonen et al. |
| 2005/0048794 A1 | 3/2005 | Brask et al. |
| 2005/0082587 A1 | 4/2005 | Marsh |
| 2005/0085031 A1 | 4/2005 | Lopatin et al. |
| 2005/0087879 A1 | 4/2005 | Won et al. |
| 2005/0089632 A1 | 4/2005 | Vehkamaki et al. |
| 2005/0092247 A1 | 5/2005 | Schmidt et al. |
| 2005/0095781 A1 | 5/2005 | Rao et al. |
| 2005/0098440 A1 | 5/2005 | Kailasam et al. |
| 2005/0118807 A1 | 6/2005 | Kim et al. |
| 2005/0124154 A1 | 6/2005 | Park et al. |
| 2005/0181555 A1 | 8/2005 | Haukka et al. |
| 2005/0208754 A1 | 9/2005 | Kostamo et al. |
| 2005/0212139 A1 | 9/2005 | Leinikka et al. |
| 2005/0229848 A1 | 10/2005 | Shinriki et al. |
| 2005/0238808 A1 | 10/2005 | Gatineau et al. |
| 2005/0266700 A1 | 12/2005 | Jursich et al. |
| 2005/0271812 A1 | 12/2005 | Myo et al. |
| 2005/0271813 A1 | 12/2005 | Kher et al. |
| 2006/0013955 A1 | 1/2006 | Senzaki |
| 2006/0019495 A1 | 1/2006 | Marcadal et al. |
| 2006/0035462 A1 | 2/2006 | Millward |
| 2006/0063375 A1 | 3/2006 | Sun et al. |
| 2006/0073276 A1 | 4/2006 | Antonissen |
| 2006/0093848 A1 | 5/2006 | Senkevich et al. |
| 2006/0118968 A1 | 6/2006 | Johnston et al. |
| 2006/0121733 A1 | 6/2006 | Kilpela et al. |
| 2006/0128150 A1 | 6/2006 | Gandikota et al. |
| 2006/0137608 A1 | 6/2006 | Choi et al. |
| 2006/0165892 A1 | 7/2006 | Weidman |
| 2006/0177601 A1 | 8/2006 | Park et al. |
| 2006/0211228 A1 | 9/2006 | Matsuda |
| 2006/0216932 A1 | 9/2006 | Kumar et al. |
| 2006/0223300 A1 | 10/2006 | Simka et al. |
| 2006/0263977 A1 | 11/2006 | Kim et al. |

(56) References Cited

U.S. PATENT DOCUMENTS

| | | |
|---|---|---|
| 2007/0014919 A1 | 1/2007 | Hamalainen et al. |
| 2007/0026654 A1 | 2/2007 | Huotari et al. |
| 2007/0036892 A1 | 2/2007 | Haukka et al. |
| 2007/0054487 A1 | 3/2007 | Ma et al. |
| 2007/0059502 A1 | 3/2007 | Wang et al. |
| 2007/0082132 A1 | 4/2007 | Shinriki et al. |
| 2007/0190782 A1 | 8/2007 | Park |
| 2008/0038465 A1 | 2/2008 | Dussurrat |
| 2008/0054472 A1 | 3/2008 | Shinriki et al. |
| 2008/0102205 A1 | 5/2008 | Barry et al. |
| 2008/0113110 A1 | 5/2008 | Elers et al. |
| 2008/0124484 A1 | 5/2008 | Shinriki et al. |
| 2008/0146042 A1 | 6/2008 | Kostamo et al. |
| 2008/0171436 A1 | 7/2008 | Koh et al. |
| 2008/0200019 A9 | 8/2008 | Huotari et al. |
| 2008/0206982 A1 | 8/2008 | Suzuki |
| 2008/0206985 A1 | 8/2008 | Kim et al. |
| 2008/0214003 A1 | 9/2008 | Xia |
| 2008/0296768 A1 | 12/2008 | Chebiam |
| 2008/0315418 A1 | 12/2008 | Boyd |
| 2008/0318417 A1 | 12/2008 | Shinriki et al. |
| 2009/0068832 A1 | 3/2009 | Haukka et al. |
| 2009/0087339 A1 | 4/2009 | Shinriki |
| 2009/0104777 A1 | 4/2009 | Kim |
| 2009/0155997 A1 | 6/2009 | Shinriki |
| 2009/0163024 A1 | 6/2009 | Kim et al. |
| 2009/0166631 A1* | 7/2009 | Yamazaki ......... H01L 29/78684 257/E29.297 |
| 2009/0209101 A1 | 8/2009 | Shinriki et al. |
| 2010/0055433 A1 | 3/2010 | Shinriki et al. |
| 2010/0099904 A1 | 4/2010 | Dupau et al. |
| 2012/0003833 A1 | 1/2012 | Khandelwal et al. |
| 2014/0141165 A1 | 5/2014 | Sato et al. |
| 2015/0211112 A1 | 7/2015 | Cadot et al. |
| 2016/0064581 A1* | 3/2016 | Urien ................. H01L 31/0749 438/57 |
| 2016/0122868 A1 | 5/2016 | Kim et al. |
| 2017/0062224 A1 | 3/2017 | Fu et al. |
| 2018/0053892 A1 | 2/2018 | Reid et al. |
| 2018/0127873 A1 | 5/2018 | Sarnet et al. |
| 2019/0067094 A1 | 2/2019 | Zope et al. |
| 2019/0148402 A1 | 5/2019 | Yoshikawa |
| 2020/0294793 A1 | 9/2020 | Kitamura et al. |
| 2021/0062331 A1 | 3/2021 | Chen et al. |
| 2021/0083057 A1 | 3/2021 | Kitamura |
| 2021/0140043 A1 | 5/2021 | Thombare et al. |
| 2021/0384035 A1 | 12/2021 | Fisher et al. |
| 2021/0404060 A1 | 12/2021 | Milligan et al. |
| 2022/0170155 A1* | 6/2022 | Blakeney ................. C23C 16/18 |

FOREIGN PATENT DOCUMENTS

| | | |
|---|---|---|
| CN | 101500989 | 8/2009 |
| DE | 410873 C | 3/1925 |
| DE | 102008026284 | 12/2009 |
| EP | 0387403 | 10/1989 |
| EP | 0394054 | 4/1990 |
| EP | 0469456 | 7/1991 |
| EP | 0442490 | 8/1991 |
| EP | 0469470 | 2/1992 |
| EP | 0573033 | 6/1993 |
| EP | 0774533 | 10/1996 |
| EP | 0880168 | 11/1998 |
| EP | 0899779 | 3/1999 |
| EP | 1167567 | 2/2002 |
| EP | 1688923 | 8/2006 |
| EP | 1983073 | 10/2008 |
| GB | 368850 | 12/1930 |
| GB | 1518243 | 7/1978 |
| GB | 2 340 508 | 2/2000 |
| JP | 58-033841 | 2/1983 |
| JP | 06-037041 | 2/1994 |
| JP | 06-069157 | 3/1994 |
| JP | 7230957 A | 8/1995 |
| JP | 08-264530 | 10/1996 |
| JP | 1998340994 A | 12/1998 |
| JP | 2003-168738 | 6/2003 |
| JP | 2009-542654 | 12/2009 |
| JP | 2011-246466 | 12/2011 |
| JP | 2012-99594 | 5/2012 |
| KR | 20010004717 A | 1/2001 |
| KR | 20010004718 A | 1/2001 |
| KR | 20010004719 A | 1/2001 |
| KR | 10-2001-0096408 | 11/2001 |
| KR | 10-2001-0112889 | 12/2001 |
| KR | 10-2003-0011399 | 2/2003 |
| KR | 10-2005-0103373 | 10/2005 |
| KR | 101464173 B1 | 10/2005 |
| KR | 10-2008-0021709 | 3/2008 |
| KR | 10-2009-0007245 | 1/2009 |
| KR | 20180028972 A | 3/2018 |
| WO | WO 1993/10652 | 5/1993 |
| WO | WO 1996/17107 | 6/1996 |
| WO | WO 1996/18756 | 6/1996 |
| WO | WO 1996/40690 | 12/1996 |
| WO | WO 1998/01890 | 1/1998 |
| WO | WO 1998/51838 | 11/1998 |
| WO | WO 1999/17343 | 4/1999 |
| WO | WO 1999/37655 | 7/1999 |
| WO | WO 2000/01006 | 1/2000 |
| WO | WO 2000/03420 | 1/2000 |
| WO | WO 2000/38191 | 6/2000 |
| WO | WO 2000/40772 | 7/2000 |
| WO | WO 2000/47404 | 8/2000 |
| WO | WO 2000/47796 | 8/2000 |
| WO | WO 2000/54320 | 9/2000 |
| WO | WO 2000/55895 | 9/2000 |
| WO | WO 2001/27347 | 4/2001 |
| WO | WO 2001/28981 | 4/2001 |
| WO | WO 2001/29280 | 4/2001 |
| WO | WO 2001/29891 | 4/2001 |
| WO | WO 2001/29893 | 4/2001 |
| WO | WO 2001/88972 | 5/2001 |
| WO | WO 2001/50502 | 7/2001 |
| WO | WO 2001/61833 | 8/2001 |
| WO | WO 2001/66832 | 9/2001 |
| WO | WO 2001/78123 | 10/2001 |
| WO | WO 2002/18394 | 3/2002 |
| WO | WO 2002/09126 | 7/2002 |
| WO | WO 2002/09158 | 7/2002 |
| WO | WO 2003/023835 | 3/2003 |
| WO | WO 2003/040150 | 5/2003 |
| WO | WO 2003/056612 | 7/2003 |
| WO | WO 2004/035858 | 4/2004 |
| WO | WO 2006/035281 | 4/2006 |
| WO | WO 2008/002546 | 1/2008 |
| WO | WO 2009/146870 | 12/2009 |
| WO | WO 2010/114386 | 10/2010 |
| WO | WO 2015/016412 | 2/2015 |
| WO | WO 2015/056944 | 4/2015 |
| WO | WO 2016/191432 | 12/2016 |

OTHER PUBLICATIONS

Aaltonen et al., "Atomic Layer Deposition of Iridium Thin Films," J. Electrochem. Soc. 151(8): G489-G492 (2004).

Aaltonen et al., "Atomic Layer Deposition of Noble Metal Thin Films," dissertation presented at the University of Helsinki, Helsinki, Finland, 2005.

Aaltonen et al., "Atomic Layer Deposition of Noble Metals: Exploration of the Low Limit of the Deposition Temperature," J. Mat. Res. Soc. 19 (11): 3353-3358 (2004).

Aaltonen et al., "Atomic Layer Deposition of Platinum Thin Films," Chem. Mater. 15: 1924-1928 (2003).

Aaltonen et al. "Atomic Layer Deposition of Ruthenium Thin Films from Ru(thd)3 and Oxygen," Chem. Vap. Deposition, 10, pp. 215-219, (2004).

Aaltonen et al. "Reaction Mechanism Studies on Atomic Layer Deposition of Ruthenium and Platinum," Electrochem. Solid-State Lett., 6 (2003), C130-133.

Aaltonen et al., "Ruthenium Thin Film Grown by Atomic Layer Deposition", Chem. Vap. Deposition, 9[1], 45, (2003).

(56) References Cited

OTHER PUBLICATIONS

Addison et al., "The Vapour Pressure of Anhydrous Copper Nitrate, and its Molecular Weight in the Vapour State," J. Chem. Soc., pp. 3099-3106 (1958).
Akerman et al., "Identifying Tunneling in Ferromagnetic-Insulator-Ferromagnetic Thin Film Structures," Journal of Magnetism and Magnetic Materials, vol. 240, Nos. 1-3, pp. 86-91, (2002).
Aoyama et al., "Chemical Vapor Deposition of Ru and Its Application in (Ba, Sr) $TiO_3$ Capacitors for Future Dynamic Random Access Memories," Jpn. J. Appl. Phys. 38(43): 2194-2199 (1999).
Aoyama et al., "Ruthenium Films Prepared by Liquid Source Chemical Vapor Deposition Using Bis-(ethylcyclopentadienyl)ruthenium", Jpn. J. Appl. Phys., vol. 38, pp. L 1134-L 1136 (1999).
Arnal et al., "Materials and processes for high signal propagation performance and reliable 32 nm node BEOL", 1-4244-1069-X-07, 2007 IEEE, pp. 1-3.
Bain et al., "Deposition of tungsten by plasma enhanced chemical vapour deposition," *J. Phys. IV France*, vol. 9, pp. 827-833 (1999).
Baklanov et al., "Characterization of Cu surface cleaning by hydrogen plasma," Journal Vac. Sci. Technol 19(4): 1201-1211 (2001).
Baliga, J., "New Designs and Materials Tackle 1 Gb Memory Challenge," Semiconductor International, World Wide Web address: semiconductor.net, Nov. 2000.
Basceri, C., "Electrical Dielectric Properties of (Ba,Sr) $TiO_3$ Thin Film Capacitors for Ultra-High Density Dynamic Random Access Memories", Thesis, 1997.
Baxter et al., "Chemical vapour deposition of electrochromic tungsten oxide films employing volatile tungsten(v1) 0x0 alkoxide/β-diketonate complexes", Chem. Commun., 1996, pp. 1129-1130.
Bobo et al., "Spin Dependent Tunneling Junctions with Hard Magnetic Layer Pinning", Journal of Applied Physics, vol. 83. No. 11, pp. 6685-6687, (1998).
Bonsu et al., "Synthesis and evaluation of κ2-β-diketonate and β-ketoesterate tungsten($_{VI}$) oxo-alkoxide complexes as precursors for chemical vapor deposition of $WO_x$ thin films", Dalton Trans., 2016, 45, pp. 10897-10908.
Browning et al., "Atomic layer deposition of $MoS_2$ films", Mater. Res. Express 2, 2015, 6 pages.
Buono-Core et al., "Synthesis and evaluation of bis-β-diketonate dioxotungsten(VI) complexes as precursors for the photodeposition of $WO_3$ films", Polyhedron, 30, 2011, pp. 201-206.
Bursky, "Hit Up IEDM For Gigabit And Denser DRAMs And Merged Logic-Memory," Electronic Design, World Wide Web address: planetee.com, Dec. 1, 1998.
Campbell et al., "Titanium dioxide (TiO2)-based gate insulators," IBM J. Res. Develop., May 1999, pp. 383-392, vol. 43, No. 3.
Chisholm et al., "The Molybdenum-Molybdenum Triple Bond. 13.[1] Preparations and Characterization of Bis(P-diketonato)tetraalkoxydimolybdenum and -ditungsten Compounds", Inorg. Chem., 1984, 23, pp. 613-618.
Chisholm et al., "Reactions of Metal-Metal Multiple Bonds. 11.[1] A Comparison of the Reactivity of $M_2(OR)_6$ (M=M) and $M_2(OR)_4(R'COCHCOR')_2$ (M=M) Compounds (M=Mu, W) with the π-Acid Ligands CO, RC=CR, and RNC", Inorg. Chem., 1984, 23, pp. 1037-1042.
Chisholm et al., "Attempts to prepare $W_2(β-diketonate)_4(M^4-M)$ complexes by reductiye elimination fromd$^3$ -d$^3$ ditungsten complexes. Preparation and structures of $W_2 R_2(NMe_2)_2$ $(Bu^t$ -acac$)_2$ and $W_2 R_2(OPr^i)_2$ $(Bu^t$ -acac$)_2$ compounds, whereR=Et, Ph, $CH_2$Ph, and BC$^{i}$", Journal of Cluster Science, Mar. 1994, vol. 5, Issue 1, pp. 67-82.
Daughton, World Wide Web nve.com-otherbiz-mram2.pdf "Advanced MRAM Concepts," p. 1-6, (Feb. 7, 2001).
Doyle, "The Reaction of Some Molybdenum and Tungsten Halides with .beta.-Diketones", Inorganic Chemistry, vol. 10, No. 10, 1971, pp. 2348-2350.
Elers et al., "NbC15 as a precursor in atomic layer epitaxy," *Applied Surface Science*, 82/83:468-474 (1994).

Fereday et al., "Anhydrous Cobalt (III) Nitrate," Chemical Communications, p. 271 (1968).
Fukuzumi et al., "Liner-Supported Cylinder (LSC) Technology to Realize Ru—$Ta_2O_5$—Ru Capacitor for Future DRAMs," IEEE, IED 2000, Session 34 (2000).
Fullerton et al., "Advanced Magnetic Recording Media for High-Density Data," Solid State Technology 44(i9): 87 (2001).
Girolami et al., "Tailored Organometallics as Low-Temperature CVD Precursors to Thin Films," *Materials Research Society Symposium Proceedings*, vol. 121, pp. 429-438, (1988).
Hiltunen et al., "Nitrides of titanium, niobium, tantalum and molybdenum grown as thin films by the atomic layer epitaxy method," *Thin Sold Films*, 166: 149-154 (1988).
Hones et al., "MOCVD of Thin Ruthenium Oxide Films: Properties and Growth Kinetics," Chem. Vap. Deposition 6(4): 193-198 (2000).
Hoyas et al., "Growth and characterization of atomic layer deposited WC0.7N0.3 on polymer films", Journal of Applied Physics, Jan. 1, 2004, vol. 95, Issue 1, pp. 381-388.
Hu et al., "In situ rapid thermal oxidation and reduction of copper thin films and their applications in ultralarge scale integration," Journal of The Electrochemical Society 148(12): G669-G675 (2001).
Hultman et al., "Review of the Thermal and Mechanical Stability of TiN-based Thin Films" Zeitscrift Fur Metallkunde 90 (10): 803-813 (1999).
Hur'yeva et al., "Ruthenium Films Deposited by Liquid-Delivery MOCVD using Bis(ethylcyclopentadienyl)ruthenium with Toulene as the Solvent", Chemical Vapor Deposition, vol. 12, pp. 429-434, (2006).
Ihanus et al., "ALE growth of $ZnS_{1-x}Se_x$ thin films by substituting surface sulfur with elemental selenium" Appl. Surface Sci., 112:154-158 (1997).
Imai, Tajuki World Wide Web nikkeibp.asiabiztech.com-nea-200008-tech_108675.html, "100 Gbit-Inch HDD Just Around the Corner," p. 1-5, (Aug. 2000).
Inoue et al., "Low thermal-budget fabrication of sputtered-PZT capacitor on multilevel interconnects for embedded FeRAM," IEEE, IED 2000, 2000, Session 34.
Jehn et al., "Gmelin Handbook of Inorganic and Organometallic Chemistry," 8th Edition, vol. A 5b, No. 54, pp. 131-154, (1993).
Jeon et al., "Study on the Characteristics of TiN Thin Film Deposited by Atomic Layer Chemical Vapor Deposition Method," *J. Vac. Sci. Technology. A*, 18(4) 1595-1598 (2000).
Jeon, H., "Study on the Characteristics of TiN Thin Film Deposited by Atomic Layer Chemical Vapor Deposition Method," AVS 46th *International Symposium*, Seattle, WA, abstract TF-MoP17 (1999).
Jung et al., "A Novel Ir—$IrO_2$—Pt-PZT-Pt—$IrO_2$—Ir Capacitor for a Highly Reliable Mega-Scale FRAM," IEEE, IED 2000, Session 34 (2000).
Juppo et al., "Deposition of copper films by an alternate supply of CuCl and Zn," *J. Vac. Sci. Technol A*, vol. 15, No. 4, pp. 2330-2333, (Jul./Aug. 1997).
Juppo et al., "Deposition of molybdenum thin films by an alternate supply of $MoCl_5$ and Zn", J. Vac. Sci. Technol. A 16(5):2845-2850 American Vacuum Society (1998).
Kadota et al., "Ruthenium Films Deposited under $H_2$ by MOCVD using a Novel Liquid Precursor", Interconnect Technology Conference 2009, IITC 2009, IEEE International, pp. 175-176, Jun. 2009.
Kang et al., "High-mobility three-atom-thick semiconducting films with wafer-scale homogeneity", Nature, Apr. 30, 2015, vol. 520, pp. 656-660.
Kattelus et al., "Electrical Properties of Tantalum Based Composite Oxide Films" *Mat. Res. Soc. Symp. Proc.* vol. 284, pp. 511-516 (1993).
Kattelus et al., "Layered tantalum-aluminum oxide films deposited by atomic layer epitaxy," Thin Solid Films, vol. 225, pp. 296-298 (1993).
Kawaguchi, "MPEG1 Decoder LSI for video CD mPD61012," *NEC Device Technology International*, New Products 5 No. 48, pp. 4-8 (Jan. 1998).
Kawamoto et al., "The Outlook for Semiconductor Processes and Manufacturing Technologies in the 0.1-μm Age," Hitachi Review 48(6): 334-339 (1999).

(56) References Cited

OTHER PUBLICATIONS

Kwon et al., "Ruthenium Bottom Electrode Prepared by Electroplating for a High Density DRAM Capacitor," J. Electrochem. Soc. 151(2): C127-C132 (2004).

Kwon et al., Plasma-enhanced atomic layer deposition of RuTiN thin films for the application of copper diffusion barrier, ALD Conference, 2004.

Kwon, et al., "Plasma-enhanced Atomic Layer Deposition of Ruthenium Thin Films", Electrochemical and Solid-State Letters, 7(4), C46-C48 (2004).

Kim et al., "Novel capacitor technology for high density stand-alone and embedded DRAMs," *IEEE International Electron Devices Meeting*, IEDM (2000).

"Kirk-Othmer Encyclopedia of Chemical Technology," $4^{th}$ Edition, vol. 4, John Wiley & Sons, Inc. pp. 841-878, (1992).

Klaus et al., "Atomic layer deposition of tungsten and tungsten nitride using sequential surface reactions," *AVS $46^{th}$ International Symposium*, Seattle, WA, abstract TF-TuM6 (1999).

Klaus et al., "Atomic layer deposition of tungsten nitride films using sequential surface reactions," *Journal of the Electrochemical Soc.*, 147 (3):1175-1181 (2000).

Klaus et al., "Atomic layer deposition of tungsten using sequential surface chemistry with a sacrificial stripping reaction," *Thin Solid Films*, 360: 145-153 (2000).

Klaus et al., "Atomically controlled growth of tungsten and tungsten nitride using sequential surface reactions," *Applied Surface Science* 162-163; 479-491 (2000).

Kukli et al., "Properties of $(Nb_{1-x}Ta_x)_2O_5$ Solid Solutions and $(Nb_{1-x}Ta_x)_2O_5-ZrO_2$ Nanolaminates Grown by Atomic Layer Epitaxy," *NanoStructured Materials*, vol. 8, No. 7, pp. 785-793 (1997).

Kukli et al. "Properties of atomic layer deposited $(Ta_{1-x}Nb_x)_2O_5$ solid solution films and $Ta_2O_5-Nb_2O_5$ nanolaminates" *J. Appl. Phys.*, 86 (10):5656-5662 (1999).

Lai et al., "Precursors for Organometallic Chemical Vapor Deposition of Tungsten Carbide Films," *Chem. Mater.*, vol. 7, pp. 2284-2292, (1995).

Lakomaa et al., "Surface reactions in $Al_2O_3$ growth from trimethylaluminum and water by atomic layer epitaxy," *Applied Surface Science*, vol. 107, pp. 107-115 (1996).

Lee et al., "Electroless CoWP boosts copper reliability, device performance," Semiconductor International, Jul. 1, 2004, 5 pages.

Lee et al., "Effects of Oxidation State and Crystallinity of Tugsten Oxide Interlayer on Photovoltaic Property in Bulk Hetero-Junction Solar Cell", J. Phys. Chem. 2012, 116, pp. 13480-13487.

Ludviksson et al., "Low-Temperature Thermal CVD of Ti—Al Metal Films Using a Strong Reducing Agent," *Chem. Vap. Deposition*, vol. 4, No. 4, pp. 129-132, (1998).

Martensson et al., "Atomic Layer Epitaxy of Copper and Tantalum," *Chemical Vapor Deposition*, vol. 3, No. 1, pp. 45-50, (1997).

Martensson et al., "CU(THD)$_2$ As Copper Source in Atomic Layer Epitaxy," *Electrochemical Society Proceedings*, vol. 97-25, pp. 1529-1536.

Martensson, "Use of atomic layer epitaxy for fabrication of Si/TiN/Cu structures," *J. Vac. Sci. Technol. B*, vol. 17, No. 5, pp. 2122-2128, (Sep./Oct. 1999).

Min et al., "Atomic Layer Deposition of TiN Films by Alternate Supply of Tetrakis (ethylmethylamino)-Titanium and Ammonia," *Jpn. J. Appl. Phys.*, vol. 37, pp. 4999-5004, (1998).

Min et al., "Atomic Layer Deposition of TiN Thin Films by Sequential Introduction of Ti Precursor and $HN_3$," *Mat. Res. Soc. Symp. Proc.*, vol. 514, pp. 337-342, (1998).

Nakajima et al., "Chemical Vapor Deposition of Tungsten Carbide, Molybdenum Carbide Nitride, and Molybdenum Nitride Films," *J. Electrochem. Soc.*, vol. 144, No. 6, pp. 2096-2100, (Jun. 1997).

Namba et al., "PEALD of Ru layer on WNC ALD barrier for Cu-porous low-k integration", Proceedings of Advanced Metallization Conference 2006, p. 39.

NEC Device Technology International, "Current state of leading edge ULSI process technology and future trends," No. 48, pp. 4-8 (1998).

Nilsen et al., "Thin Film Deposition of Lanthanum Manganite Perovskite by the ALE process," Journal of Materials Chemistry, vol. 9, 1781-1784, (1999).

Onda et al., "DC-Hydrogen plasma cleaning a novel process for IC-packaging," Semicon West 97, Packaging Materials Conference, 1997, pp. D-1-D-10.

Pakrad, "Pure Tech: Growth of MR-GMR Head Materials," World Wide Web, Puretechinc.com-tech_papers-tech_papers-4.htm, pp. 1-2, (1999).

Paranjpe et al., "Atomic Layer Deposition of AlOx for thin Film Head Gap Applications", Journal of Electrochemical Society, V 148 (9), G465-G471.

Park et al., "Metallorganic Chemical Vapor Deposition of Ru and RuO2 using Ruthenocene Precursor and Oxygen Gas", J. Electrochem. Soc., 147[1], p. 203, (2000).

Parsons et al., "Microcontact Patterning of Ruthenium Gate Electrodes by Selective Area," North Carolina State university, presentation at AVS conference on Atomic Layer Deposition (ALD 2004), Helsinki, Finland, Aug. 16, 2004.

Polyakov et al., "Growth of GaBN Ternary Solutions by Organometallic Vapor Phase Epitaxy," *Journal of Electronic Materials*, Vo. 26, No. 3, pp. 237-242, (1997).

Practical Integrated Circuit Fabrication Seminar, Integrated Circuit Engineering Corporation, (1998).

Riihela et al., "Introducing atomic layer epitaxy for the deposition of optical thin films", Thin Solid Films vol. 289:250-255 (1996).

Ritala et al., "Atomic layer epitaxy growth of TiN thin films," *J. Electrochem. Soc.*, 142(8):2731-2737 (1995).

Ritala et al, "Controlled Growth of TaN, Ta3N5, and TaOxNy Thin Films by Atomic Layer Deposition" Chem. Mater. 1999, 11, 1712-1718.

Ritala, M. et al., "Surface roughness reduction in atomic layer epitaxy growth of titanium dioxide thin films," *Thin Solid Films*, vol. 249, pp. 155-162 (1994).

Ritala et al., "Atomic Layer Epitaxy Growth of TiN Thin Films from $TiI_4$ and $NH_3$," *J. Electrochem. Soc.*, vol. 145, No. 8, pp. 2914-2920, (Aug. 1998).

Ritala et al., "Atomic Layer Deposition," Handbook of Thin Film Materials vol. 1: Deposition and Processing of Thin Films, chapter 2, pp. 103-159 (2002).

Rossnagel, "The latest on Ru—Cu interconnect technology," Solid State Technology, Feb. 2005, Online, pp. 1-4.

Satta et al., "The Removal of Copper Oxides by Ethyl Alcohol Monitored in Situ by Spectroscopic Ellipsometry," Journal of the Electromechanical Society, 150 (5) , pp. 300-306 (2003).

Shao et al., "An alternative low resistance MOL technology with electroplated rhodium as contact plugs for 32nm CMOS and beyond", 1-4244-1070-3-07, 2007 IEEE.

Sherman et al., "Plasma enhanced atomic layer deposition of Ta for diffusion barrier applications," AVS $46^{th}$ International Symposium, Paper TF-TuM5 (abstract), (Oct. 26, 1999), Seattle, WA.

Singer, "Progress in Copper: A Look Ahead", Semiconductor International, May 1, 2002.

SOI Technology: IMB's Next Advance in Chip Design, 1998.

Solanki et al., "Atomic Layer Deposition of Copper Seed Layers," Electrochemical and Solid-State Letters 3(10): 479-480 (2000).

Sundani et al., "Oral Presentation of Dual Damascene Process," slides, Nov. 19, 1998.

Suntola, "Atomic Layer Epitaxy," Handbook of Crystal Growth, vol. 3, chapter 14, pp. 601-663 (1994).

Tulhoff et al., "Ullmann's Encyclopedia of Industrial Chemistry," 5th, Completely Revised Edition, vol. A5, pp. 61-77, (1986).

Tung et al., "Atomic layer deposition of noble metals: Exploration of the low limit of the deposition temperature", J Mater. Res., vol. 19(11):3353-3357 (Nov. 2004).

Ueno et al., "Cleaning of CHF3 plasma-etched SiO2—SiN—Cu via structures using a hydrogen plasma, an oxygen plasma and hexafluoracetylacetone vapors," J. Vac. Sci. Technology B vol. 16, No. 6, pp. 2986-2995 (1998).

Utriainen et al., "Studies of metallic thin film growth in an atomic layer epitaxy reactor using $M(acac)_2$ (M=Ni, Cu, Pt) precursors," Applied Surface Science 157: 151-158 (2000).

(56) References Cited

OTHER PUBLICATIONS

Utriainen et al., "Studies of NiO thin film formation by atomic layer epitaxy," Materials Science and Engineering B54: 98-103 (1998).
Wang, "Advanced Materials for Extremely High Density Magnetic Recording Heads," Department of Materials Science and Engineering, Department of Electrical Engineering, Stanford University, Stanford, CA 94305-4045, presentation.
Winbond News Release, "Successful development of capacitor technology for next generation memory," World Wide Web address: winbond.com, Dec. 13, 2000.
Won et al., "Conformal CVD-ruthenium process for MIM capacitor in giga-bit DRAMs," IEEE, IED 2000, Session 34 (2000).
World Wide web, magahaus.com-tech-westerndigital-shitepapers-gmr_wp.shtml, "GMR Head Technology: Increased Areal Density and Improved Performance Areal Density," pp. 1-4, (Feb. 2000).
World Wide Web, pc.guide.com-ref-hdd-op-heads-techGMR-c.html, "Giant Magnetoresistive (GMR) Heads," pp. 1-4.
World Wide web, semiconductor.net-semiconductor-issues-Issues-1998-feb98-docs-emerging.asp, "GMR Read-Write Heads Yield Data Storage Record," pp. 1-2 (Feb. 1998).
World Wide Web, stoner.leeds.ac.uk-research-gmr.htm, "Giant Magnetoresistance," pp. 1-6.
Xu et al., "A breakthrough in low-k barrier-etch stop films for copper damascene applications," Semiconductor Fabtech, 2000, pp. 239-244, 11th Edition.
Yagishita et al., "Cleaning of Copper Surface Using Vapor-Phase Organic Acids," MRS Proceedings, vol. 766, MRS Spring 2003 Meeting, Apr. 21-25, 2003, Symposium E, Session E3, Paper E3.28.
Yang et al., "Physical, Electrical, and Reliability Characterization of Ru for Cu Interconnects", 2006 International Interconnect Technology Conference, pp. 187-190, ISBN 1-4244-0103-8-06, 2006 IEEE.
Yang et al., "Atomic Layer Deposition of Tungsten Film from WF6/B2H6: Nucleation Layer for Advanced Semiconductor Devices."
Advanced Metallization Conference 2001 (AMC 2001), Conference Proceedings ULSI XVII@2002 Materials Research Society, pp. 655-660.
Yoon et al., "Development of an RTA process for the enhanced crystallization of amorphous silicon thin film," Electrochemical Society Proceedings 2000-9: 337-343 (2000).
Yoon et al., "Investigation of $RuO_2$-incorporated Pt layer as a Bottom Electrode and Diffusion Barrier for High Epsilon Capacitor Applications," Electrochemical and Solid-State Letters 3(8): 373-376 (2000).
Yoon et al., "Tantalum-ruthenium dioxide as a diffusion barrier between Pt bottom electrode and $TiSi_2$ ohmic contact layer for high density capacitors," Journal of Applied Physics 86(5): 2544-2549 (1999).
Yoon et al., $197^{th}$ Meeting Program Information II, The Electrochemical Society, $197^{th}$ Meeting—Toronto, Ontario, Canada, May 14-18, 2000, Program Information, I1—Rapid Thermal and Other Short-Time Processing Technologies I, Electronics Division—Dielectric Science and Technology Division—High Temperature Materials Division, 2000, Wednesday, May 17, 2000, New Applications of RTP, Co-Chairs: A. Fiory and D.-L Kwong, time 11:10 Abs#550, Title: Development of RTA Process for the Crystallization of a-Si Thin Film—Y.-G. Yoong, T.-K. Kim, K.-B. Kim J.-Y. Chio, B.-I. Lee, and S.-K. Joo (Seoul National Univ.).
Zelazowlska et al., "$WO_3$-based electrochromic system with hybrid organic-inorganic gel electrolytes", Journal of Non-Crystalline Solids, 354, 2008, pp. 4500-4505.
Zhang et al., "High permittivity thin film nanolaminates," *Journal of Applied Physics*, vol. 87, No. 4, pp. 1921-1924 (2000).
Sakurai et al., "Adsorption of ruthenium tetroxide on metal surfaces," J. Phys. Chem. American Chemical Society, vol. 89, pp. 1892-1896 (1985).
Mazurenko et al., "Synthesis, thermal stability, and IR and UV spectra of molybdenum and tungsten B-diketone complexes", Probl. Khim. Primen. B [Beta]-Diketonatov Met., [Mater, Vses. Semin.] (1982).

* cited by examiner

VAPOR DEPOSITION OF FILMS COMPRISING MOLYBDENUM

REFERENCE TO RELATED APPLICATIONS

The present application claims priority to U.S. Application No. 63/043,271, filed Jun. 24, 2020, which is incorporated herein by reference in its entirety.

BACKGROUND OF THE INVENTION

Field of the Invention

This application generally relates to vapor deposition processes for forming films comprising molybdenum. Thin films comprising molybdenum carbon can be deposited by cyclical vapor deposition processes, such as atomic layer deposition, for example using CO and $H_2$ as reducing agents.

Description of the Related Art

Titanium nitride (TiN) is one of the most widely used materials in the semiconductor industry and as such is deposited for many purposes, e.g., liner, barrier/adhesion layers, etc. However, TiN films have relatively high resistivity and cannot be scaled to higher p-metal work function requirements for advanced IC nodes. Molybdenum carbide films can provide an alternative to TiN films. However, deposition processes for forming molybdenum films utilizing halide reactants have typically had the disadvantage of etching or contaminating other materials.

SUMMARY

In one aspect, vapor deposition methods of depositing thin films comprising molybdenum are provided. In some embodiments, the thin films comprise molybdenum and carbon, such as molybdenum carbide (MoC, $Mo_2C$) thin films, molybdenum oxycarbide (MoOC) thin films, molybdenum oxycarbide nitride (MoOCN) thin films or molybdenum carbon nitride (MoCN) thin films by vapor deposition processes are provided. In some embodiments the deposition processes are atomic layer deposition (ALD) process.

In some embodiments a vapor deposition process for forming a thin film comprising molybdenum, such as a thin film comprising molybdenum and carbon, on a substrate in a reaction space comprises a plurality of deposition cycles comprising contacting the substrate with a first reactant comprising a vapor phase molybdenum precursor, such as a molybdenum halide, and subsequently contacting the substrate with a vapor phase second reactant for example comprising carbon and oxygen, such as CO, and a vapor phase third reactant comprising hydrogen, such as $H_2$. The deposition cycle may be repeated two or more times to form a thin film comprising molybdenum. In some embodiments the thin film comprises molybdenum and carbon. In some embodiments the substrate is alternately and sequentially contacted with the first reactant, the second reactant and the third reactant. In some embodiments the substrate is contacted with the first reactant and subsequently contacted simultaneously with the second and third reactants.

In some embodiments the thin film is a MoC, $Mo_2C$ or MoOC thin film. In some embodiments the thin film is a MoOCN or MoCN thin film. In some embodiments the thin film is a molybdenum thin film.

In some embodiments the molybdenum precursor is a molybdenum halide, such as $MoCl_5$, $MoBr_2$ or $MoI_3$. In some embodiments the molybdenum precursor is a molybdenum oxyhalide, such as $MoOCl_4$ or $MoO_2Cl_2$.

In some embodiments the only reactants used in the deposition cycle are the molybdenum precursor, the second reactant and the third reactant. In some embodiments the only reactants used in the deposition cycle are the molybdenum precursor, CO and $H_2$.

In some embodiments the deposition process further comprises contacting the substrate with one or more additional reactants. In some embodiments a fourth reactant comprises nitrogen, for example a fourth reactant comprising $NH_3$. In some embodiments a fourth reactant comprises oxygen. In some embodiments the substrate is contacted with an oxygen reactant such as $H_2O$, $O_3$, $H_2O_2$, $N_2O$, $NO_2$ or NO. In some embodiments the substrate is contacted with a fourth reactant after contacting the substrate with the first reactant and prior to contacting the substrate with the second and the third reactants. In some embodiments the substrate is contacted with a fourth reactant after being contacted with the first, second and third reactants.

In some embodiments the deposition cycle comprises, in order, contacting the substrate with the first reactant comprising a molybdenum precursor, contacting the substrate with the second reactant such as CO and contacting the substrate with the third reactant such as $H_2$. In some embodiments the deposition cycle comprises, in order, contacting the substrate with the first precursor and subsequently simultaneously contacting the substrate with the second and third reactants. In some embodiment the third reactant further comprises $NH_3$. In some embodiments the substrate is separately contacted with a fourth reactant comprising $NH_3$.

In some embodiments a cobalt thin film is deposited over the molybdenum-containing thin film.

In some embodiments a deposition cycle for depositing molybdenum carbide or molybdenum oxycarbide comprises, in order, contacting a substrate with a first reactant comprising a molybdenum precursor, contacting the substrate with a second reactant comprising CO and contacting the substrate with a third reactant comprising $H_2$. In some embodiments the deposition cycle comprises, in order, contacting the substrate with the first precursor and subsequently simultaneously contacting the substrate with the second and third reactants.

In some embodiments a process for forming a thin film comprising molybdenum, carbon and nitrogen on a substrate in a reaction space comprises a deposition cycle comprising contacting the substrate with a first reactant comprising a molybdenum precursor, such as a molybdenum halide, and subsequently contacting the substrate with a second reactant comprising CO and a third reactant comprising $NH_3$.

The deposition cycle may be repeated two or more times to form a thin film of a desired thickness. In some embodiments excess reactant and reaction byproducts, if any, are removed from the reaction space after each contacting step, for example after contacting the substrate with the first reactant and prior to contacting the substrate with the second and/or third reactant.

In some embodiments the only reactants that are used in a deposition cycle are a molybdenum halide, CO and $H_2$. In some embodiments the only reactants that are used in a deposition cycle are a molybdenum halide, CO and $NH_3$. In some embodiments the third reactant comprises $NH_3$ and $H_2$. In some embodiments the only reactants that are used in a deposition cycle are a molybdenum halide, CO, $H_2$ and $NH_3$.

BRIEF DESCRIPTION OF THE DRAWINGS

Embodiments described herein will be better understood from the Detailed Description and from the appended Drawings, which are meant to illustrate and not to limit the invention, and wherein.

DETAILED DESCRIPTION OF THE PREFERRED EMBODIMENT

Vapor deposition processes can be used to deposit material comprising molybdenum, such as thin films comprising molybdenum, thin films comprising molybdenum and carbon and thin films comprising molybdenum, carbon and nitrogen. In some embodiments the vapor deposition processes utilize a first reactant comprising a molybdenum precursor, such as a molybdenum halide, a second vapor phase reactant and a third vapor phase reactant. In some embodiments one or both of the second and third reactants can comprise a reducing agent. In some embodiments both the second and third reactants comprise a reducing agent. In some embodiments the second reactant comprises a carbon source, e.g., CO. In some embodiments the third reactant comprises $H_2$ and/or $NH_3$. In some embodiments, the third vapor phase reactant may comprise hydrazine. In some embodiments an additional reactant is utilized and may also comprise, for example, $H_2$ and/or $NH_3$. In some embodiments an additional reactant comprising oxygen may be utilized, for example as $H_2O$, $O_3$, $H_2O_2$, $N_2O$, $NO_2$ or $NO$. In some embodiments thin films comprising molybdenum, such as molybdenum films, thin films comprising molybdenum and carbon such as molybdenum carbide (e.g., MoC, $Mo_2C$) thin films, molybdenum oxycarbide (MoOC) thin films, or thin films comprising molybdenum, carbon and nitrogen, such as molybdenum oxycarbon nitride (MoOCN) thin films or molybdenum carbon nitride (MoCN) thin films are deposited by vapor deposition processes. In some embodiments the vapor deposition processes are atomic layer deposition (ALD) processes.

Figure 1A:
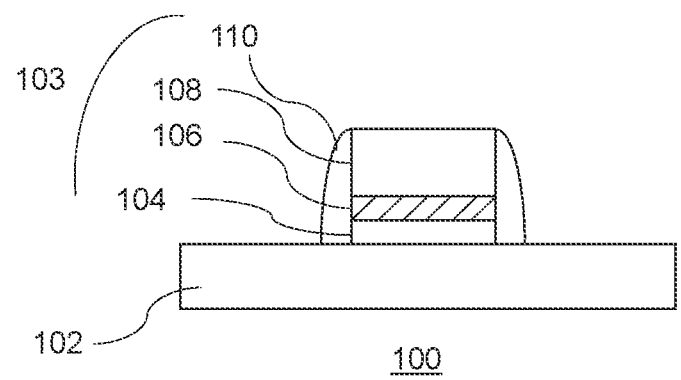
FIG. 1A is a simplified cross section view of a semiconductor device structure according to certain embodiments.
Figure 1B:
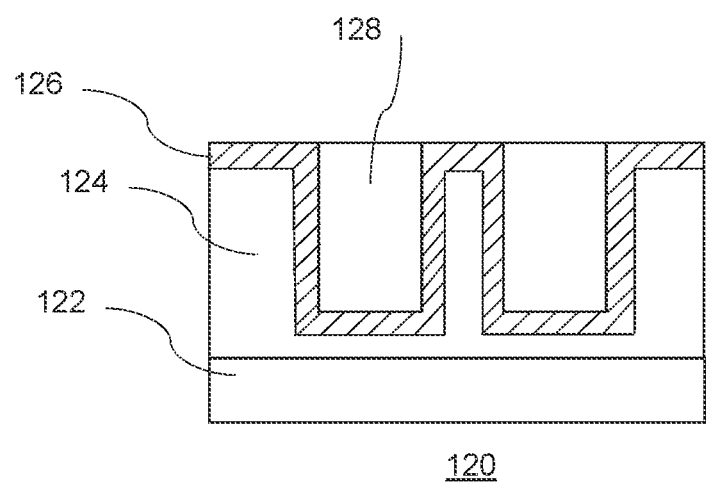
FIG. 1B is a simplified cross section view of a gap-fill structure according to certain embodiments.

In some embodiments thin films comprising molybdenum or molybdenum and carbon, such as molybdenum carbide, molybdenum oxycarbide, molybdenum carbon nitride or molybdenum oxycarbon nitride, are deposited by the disclosed methods and can be used in any of a variety of contexts, for example, as a gate material in a CMOS structure or as a barrier/adhesion layer for a gap fill structure, for example as illustrated in FIGS. 1A and 1B. In some embodiments the thin films can be used as an adhesion layer in a cobalt gap-fill process. In some embodiments the thin films can be used as a low-resistivity P-metal for a metal gate. In some embodiments the thin films can be used as a low resistivity barrier or nucleation layer for metallization in logic or memory applications.

As non-limiting examples, FIG. 1A is a simplified cross-sectional view of a semiconductor device structure 100 according to certain embodiments, and FIG. 1B is a simplified cross-sectional view of a gap-fill structure 120 according to certain embodiments. Referring to FIG. 1A, the semiconductor device structure 100 comprises a substrate 102 and a gate structure 103 on the substrate 102. The gate structure 103 comprises a gate dielectric layer 104 on the substrate, a gate metal layer 106 comprising molybdenum and carbon, such as MoC, $Mo_2C$, MoOC, MoOCN or MoCN, on the gate dielectric layer 104, and a conductive layer 108 on the gate metal layer 106. A spacer 110 may be formed on sidewalls of the gate dielectric layer 104, the gate metal layer 106, and the conductive layer 108. In some embodiments, the gate metal layer 106 can comprise molybdenum and carbon and can be formed by a vapor deposition process as described herein, such as by an atomic layer deposition process. In some embodiments, the gate metal layer 106 can comprise molybdenum oxycarbide.

Referring to FIG. 1B, the gap-fill structure 120 comprises a substrate 122, a dielectric layer 124, a barrier/adhesion layer 126 comprising molybdenum and carbon, such as MoC, $Mo_2C$, MoOC, MoOCN, or MoCN, and a gap-fill layer 128. The dielectric layer 124 is patterned and the barrier/adhesion layer 126 is formed conformally on the patterned dielectric layer, e.g., on the bottom and side of a recess. The gap-fill layer 128 fills the recess. In some embodiments, the barrier/adhesion layer 126 can be formed by a vapor deposition process as described herein, such as by an atomic layer deposition process. In some embodiments the gap-fill layer 128 comprises cobalt. In some embodiments, the barrier/adhesion layer 126 can comprise molybdenum oxycarbide.

The gate metal layer 106 comprising molybdenum and carbon, such as MoC, $Mo_2C$, MoOC, MoOCN, or MoCN, and the barrier/adhesion layer 126 comprising molybdenum and carbon, such as MoC, $Mo_2C$, MoOC, MoOCN, or MoCN, can provide low resistivity as compared to TiN that is typically used in these contexts. Other contexts in which the disclosed molybdenum- and carbon-containing thin films may be utilized will be apparent to the skilled artisan.

Atomic Layer Deposition (ALD)

As noted above, vapor deposition processes are provided for depositing material comprising molybdenum, or molybdenum and carbon, such as Mo, MoC, $Mo_2C$, MoOC, MoOCN, or MoCN thin films. In some embodiments the vapor deposition processes are atomic layer deposition processes in which a substrate surface is alternately and sequentially contacted with two or more reactants.

In some embodiments a material comprising molybdenum is deposited on a substrate in a reaction space by contacting the substrate surface with three reactants: a first reactant comprising a molybdenum precursor, a second reactant and a third reactant. In some embodiments the second reactant comprises carbon, such as CO. In some embodiments the third reactant comprises $H_2$ and/or $NH_3$. In some embodiments the second reactant comprises a first reducing agent and the third reactant comprises a second reducing agent. In some embodiments the first reducing agent is different from the second reducing agent. In some embodiments the first reducing agent and the second reducing agent are the same. In some embodiments the first reducing agent may comprise carbon. In some embodiments the second reducing agent comprises hydrogen. In some embodiments a first reactant comprises a molybdenum precursor, a second reactant comprises CO and a third reactant comprises $H_2$. In some embodiments a deposition process comprises a deposition cycle in which a substrate in a reaction chamber is alternately and sequentially contacted with a first reactant comprising a vapor phase molybdenum precursor, a second reactant comprising a first reducing agent and a third reactant comprising a second reducing agent. In some embodiments a substrate in a reaction chamber is alternately and sequentially contacted with a first reactant comprising a vapor phase molybdenum precursor, a second reactant comprising CO and a third reactant comprising $H_2$. In some embodiments the substrate is contacted simultaneously with the second and third reactants. The deposition cycle may be repeated two or more times to deposit a thin film of a desired thickness.

Although called the first reactant, second reactant and third reactant they are not necessarily contacted with the substrate in that order in the deposition cycle. In some embodiments the reactants are contacted with the substrate in the order of the first reactant, second reactant and third reactant. In some embodiments the substrate is contacted with one or both of the second or third reactants before the first reactant. In some embodiments the substrate is contacted sequentially with the first reactant comprising the molybdenum precursor and then with the second and third reactants.

In some embodiments the substrate is contacted first with the first reactant comprising the molybdenum precursor and then subsequently contacted simultaneously with the second and third reactants, for example with CO and $H_2$. In some embodiments the first reactant comprising the molybdenum precursor, the second reactant and the third reactant are the only reactants utilized in a deposition cycle. In some embodiments the molybdenum precursor, CO and $H_2$ are the only reactants utilized in a deposition cycle. In some embodiments the thin film deposited using the molybdenum precursor, CO and $H_2$ comprises Mo, MoC, $Mo_2C$, or MoOC. In some embodiments the ratio of CO and $H_2$ can be tuned to deposit MoOC. Tuning may be accomplished, for example, by adjusting the exposure time of the substrate to each of the reactants or by adjusting the ratio of the reactants that are provided in the entire deposition process.

In some embodiments a material comprising molybdenum, carbon and nitrogen is deposited on a substrate in a reaction space by contacting the substrate surface with a first reactant comprising a molybdenum precursor, a second reactant comprising a first reducing agent and a third reactant comprising a nitrogen reactant, such as $NH_3$. In some embodiments a deposition process comprises a deposition cycle in which a substrate is alternately and sequentially contacted with a first reactant comprising a vapor phase molybdenum precursor, a second reactant comprising carbon, such as CO and a third reactant comprising nitrogen, such as $NH_3$. In some embodiments the substrate may be contacted simultaneously with the second and third reactants. The deposition cycle may be repeated two or more times to deposit a thin film of a desired thickness.

Although called the first reactant, second reactant and third reactant they are not necessarily contacted with the substrate in that order in the deposition cycle. In some embodiments the reactants are contacted with the substrate in the order of the first reactant, second reactant and third reactant. In some embodiments the substrate is contacted with one or both of the second or third reactants before the first reactant. In some embodiments the substrate is contacted sequentially with the first reactant comprising the molybdenum precursor and then with the second and third reactants.

In some embodiments a deposition process comprises a deposition cycle in which a substrate is alternately and sequentially contacted with a first reactant comprising a vapor phase molybdenum precursor, CO and $NH_3$. In some embodiments the substrate is contacted simultaneously with the CO and $NH_3$. In some embodiments the substrate is contacted sequentially with the first reactant comprising the molybdenum precursor and then with the second and third reactants. In some embodiments the substrate is contacted first with the first reactant comprising the molybdenum precursor and then subsequently contacted simultaneously with the second and third reactant, for example with CO and $NH_3$. In some embodiments the molybdenum precursor, CO and $NH_3$ are the only reactants utilized in a deposition cycle. In some embodiments the thin film comprises MoCN or MoOCN. In some embodiments the ratio of CO to $NH_3$ can be tuned to deposit MoOCN.

In some embodiments a material comprising molybdenum, carbon and nitrogen is deposited on a substrate in a reaction space by contacting the substrate surface with a first reactant comprising a molybdenum precursor, a second reactant comprising a first reducing agent, a third reactant comprising a second reducing agent, such as $H_2$ and a fourth reactant comprising a nitrogen reactant, such as $NH_3$. In some embodiments a deposition process comprises a deposition cycle in which a substrate is alternately and sequentially contacted with a first reactant comprising a vapor phase molybdenum precursor, a second reactant comprising carbon, such as CO, a third reactant comprising $H_2$ and a fourth reactant comprising nitrogen, such as $NH_3$. In some embodiments the substrate is contacted simultaneously with at least two of the second, third and fourth reactants. In some embodiments the substrate is contacted simultaneously with the second and third reactants. In some embodiments the substrate is contacted simultaneously with the third and fourth reactants. In some embodiments the substrate is contacted simultaneously with the second and fourth reactants. In some embodiments the substrate is contacted simultaneously with the second, third and fourth reactants. The deposition cycle may be repeated two or more times to deposit a thin film of a desired thickness.

Although called the first reactant, second reactant, third reactant and fourth reactant they are not necessarily contacted with the substrate in that order in the deposition cycle. In some embodiments the reactants are contacted with the substrate in the order of the first reactant, second reactant, third reactant and fourth reactant. In some embodiments the substrate is contacted with one or more of the second, third and/or fourth reactants before the first reactant. In some embodiments the substrate is contacted sequentially with the first reactant comprising the molybdenum precursor and then with the first, second and third reactants.

In some embodiments the substrate is alternately and sequentially contacted with a first reactant comprising a vapor phase molybdenum precursor, CO, $H_2$ and $NH_3$. In some embodiments the substrate is contacted simultaneously with the CO, $H_2$ and/or $NH_3$. In some embodiments a substrate is alternately and sequentially contacted with a first reactant comprising a vapor phase molybdenum precursor, CO, $H_2$ and $NH_3$. In some embodiments the substrate is contacted with the first reactant comprising the molybdenum precursor and then separately contacted with one of CO, $H_2$ and $NH_3$ and then simultaneously contacted with two or more of the others of the CO, $H_2$ and $NH_3$.

In some embodiments the substrate is contacted sequentially with first reactant comprising the molybdenum precursor, the second reactant and then contacted simultaneously with the third and fourth reactants. For example, the substrate may be contacted sequentially with the first reactant comprising the molybdenum precursor and CO and then contacted simultaneously with $H_2$ and $NH_3$. In some embodiments the substrate is contacted first with the first reactant comprising the molybdenum precursor and then subsequently contacted simultaneously with the second, third and fourth reactants, for example with CO, $H_2$ and $NH_3$. In some embodiments the first reactant comprising a molybdenum precursor, the second reactant comprising carbon, such as CO, the third reactant comprising a reducing agent such as $H_2$ and the fourth reactant comprising a nitrogen reactant, such as $NH_3$, are the only reactants used in a deposition cycle. In some embodiments the molybdenum precursor, CO, $H_2$ and $NH_3$ are the only reactants utilized in the deposition cycle. In some embodiments the thin film comprises MoOCN, or MoCN. In some embodiments the ratio of the second reactant to the third reactant and fourth reactant is tuned to preferentially deposit MoCN or MoOCN.

In some embodiments the molybdenum precursor comprises a molybdenum halide. In some embodiments the molybdenum precursor comprises a molybdenum oxyhalide. For example, in some embodiments the molybdenum precursor may comprise at least one of $MoO_2Cl_2$, $MoCl_5$, $MoOCl_4$, $MoBr_2$, or $MoI_3$. In some embodiments, the molybdenum precursors may consist of at least one of $MoO_2Cl_2$, $MoCl_5$, $MoOCl_4$, $MoBr_2$, or $MoI_3$.

In some embodiments a molybdenum oxyhalide is used in a deposition process to deposit Mo, MoOC or MoOCN. For example, in some embodiments Mo films are deposited by a deposition cycle in which the substrate is contacted with a first reactant comprising a molybdenum precursor comprising $MoO_2Cl_2$ or $MoOCl_4$, a second reactant comprising carbon, such as CO and a third reactant comprising a reducing agent, such as $H_2$. In some embodiments the second reactant comprises a reducing agent and the reducing agents in the first and second reactants are different. In some embodiments the reducing agents may be the same.

In some embodiments, the deposition process is an atomic layer deposition (ALD) process. In some embodiments conformal thin films comprising molybdenum and carbon are deposited, for example on a three-dimensional structure on a substrate. Among vapor deposition techniques, ALD has the advantage of typically providing high conformality at low temperatures.

ALD type processes are based on controlled, surface reactions of precursor chemicals. In some embodiments the surface reactions are generally self-limiting. Gas phase reactions are typically avoided by feeding the precursors alternately and sequentially into the reaction chamber. Vapor phase reactants are separated from each other in the reaction chamber, for example, by removing excess reactants and/or reactant by-products from the reaction chamber between reactant pulses.

Before starting the deposition of the film, the substrate is typically heated to a suitable growth temperature, as discussed above. Briefly, a substrate is heated to a suitable deposition temperature, generally at lowered pressure. The preferred deposition temperature may vary depending on a number of factors such as, and without limitation, the reactant precursors, the pressure, flow rate, the arrangement of the reactor, and the composition of the substrate including the nature of the material to be deposited on. Deposition temperatures are generally maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved. Here, the temperature varies depending on the precursors being used and is generally at or below about 700° C. In some embodiments the deposition temperature is generally at or above about 100° C. and at or below about 700° C. In some embodiments the deposition temperature is between about 200° C. and about 700° C., and in some embodiments the deposition temperature is between about 300° C. and about 500° C. In some embodiments, the deposition temperature is below about 500° C., below about 400° C. or below about 300° C. In some instances the deposition temperature can be above about 200° C., above about 150° C. or above about 100° C. In some embodiments lower deposition temperatures can be achieved, for example, if additional reactants or reducing agents, such as reactants or reducing agents comprising hydrogen, are used in the process.

In a deposition cycle, the surface of the substrate is contacted with a first reactant comprising a vapor phase molybdenum precursor, also referred to as a molybdenum precursor. In some embodiments a pulse of vapor phase molybdenum precursor is provided to a reaction space containing the substrate (for example, in time divided ALD). In some embodiments the substrate is moved to a reaction space containing vapor phase molybdenum precursor (for example, in space divided ALD, also known as spatial ALD). Conditions can be selected such that no more than about one monolayer of the molybdenum precursor or a species thereof is adsorbed on the first surface of the substrate. Conditions may be selected such that the precursor adsorbs in a self-limiting manner. The appropriate contacting times can be readily determined by the skilled artisan based on the particular circumstances. Excess first reactant and reaction byproducts, if any, are removed from the substrate surface, such as by purging with an inert gas or by removing the substrate from the presence of the first reactant.

The molybdenum precursor and additional reactants are typically kept separated and contact the substrate separately. In particular, the molybdenum precursor is typically provided separately from the other reactants. However, as discussed herein, in some embodiments two or more of the additional reactants can be provided together. Moreover, in some arrangements, such as hybrid CVD/ALD, or cyclical CVD, processes can allow overlap of the different mutually reactive reactants over the substrate and thus can produce more than a monolayer per cycle. Vapor phase precursors and/or vapor phase byproducts are removed from the substrate surface, such as by evacuating a chamber with a vacuum pump and/or by purging (for example, replacing the gas inside a reactor with an inert gas such as argon or nitrogen). Supply of the precursor or reactant to the substrate surface is typically stopped during the removal periods, and may be shunted to a different chamber or to a vacuum pump during the removal periods. Typical removal times are from about 0.05 to 20 seconds, from about 1 to 10 seconds, or from about 1 to 2 seconds. However, other removal times can be utilized if necessary, such as where highly conformal step coverage over extremely high aspect ratio structures or other structures with complex surface morphology is needed.

The surface of the substrate is contacted with a vapor phase second reactant. In some embodiments the second reactant comprises a first reducing agent In some embodiments the second reactant comprises carbon. In some embodiments the second reactant comprises CO. In some embodiments the second reactant comprises CO and $H_2$. In some embodiments the second reactant comprises CO, $H_2$ and $NH_3$. In some embodiments, a pulse of a second reactant is provided to a reaction space containing the substrate. In some embodiments, the substrate is moved to a reaction space containing the vapor phase second reactant. Excess second reactant and gaseous byproducts of the surface reaction, if any, are removed from the substrate surface. In some embodiments a deposition cycle comprises alternately and sequentially contacting the substrate with the molybdenum precursor and the second reactant. In some embodiments one or more additional reactants are utilized.

In some embodiments, following removal of the second reactant and gaseous byproducts, in some embodiments the surface of the substrate is contacted with a third vapor phase reactant or precursor. In some embodiments the third vapor phase reactant comprises a second reducing agent. In some embodiments the second reducing agent is different from the first reducing agent. In some embodiments the second reducing agent is the same as the first reducing agent. In some embodiments the third vapor phase reactant comprises hydrogen. In some embodiments the third vapor phase reactant comprises $H_2$. In some embodiments the third vapor phase reactant comprises $NH_3$. In some embodiments the third vapor phase reactant comprises both $NH_3$ and $H_2$. In some embodiments, a pulse of a third reactant is provided to a reaction space containing the substrate. In some embodiments, the substrate is moved to a reaction space containing the vapor phase third reactant. Excess third reactant and gaseous byproducts of the surface reaction, if any, are removed from the substrate surface.

In some embodiments the second and third reactants may be provided simultaneously or in overlapping pulses. For example, in some embodiments a second reactant comprising CO and a third reactant comprising $H_2$ are provided simultaneously or in overlapping pulses.

In some embodiments the substrate may be contacted with a fourth vapor-phase reactant. In some embodiments the fourth vapor-phase reactant comprises a third reducing agent. In some embodiments the fourth vapor-phase reactant comprises one or both of $H_2$ and/or $NH_3$. In some embodiments the third vapor phase reactant is one of $H_2$ or $NH_3$ and the fourth vapor phase reactant is the other of $H_2$ and $NH_3$. For example, in some embodiments the third vapor phase reactant comprises $H_2$ and the fourth vapor phase reactant comprises $NH_3$. In some embodiments, a pulse of a fourth reactant is provided to a reaction space containing the substrate. In some embodiments, the substrate is moved to a reaction space containing the vapor phase fourth reactant. Excess fourth reactant and gaseous byproducts of the surface reaction, if any, are removed from the substrate surface.

In some embodiments two or more of the second, third and fourth reactants may be provided simultaneously or in overlapping pulses. For example, in some embodiments a third reactant comprising $H_2$ and a fourth reactant comprising $NH_3$ are provided simultaneously or in overlapping pulses. In some embodiments the substrate is separately contacted with the first reactant comprising the molybdenum precursor, even if it is contacted simultaneously with two or more of the additional reactants.

Although referred to as first, second, third and fourth reactants, the reactants may be provided in different orders. In some embodiments the molybdenum precursor is provided before any of the other reactants. In some embodiments the molybdenum precursor is provided after one or more of the additional reactants. In some embodiments the reactants are provided in the same order in each deposition cycle. In some embodiments the reactants are provided in different orders in different deposition cycles.

Contacting and removing are repeated until a thin film of the desired thickness has been formed on the substrate, with each cycle leaving no more than about a molecular monolayer in an ALD or ALD type process, or one or more molecular monolayers in a hybrid CVD/ALD, or cyclical CVD process.

Each reactant is conducted or pulsed into the chamber in the form of vapor phase pulse and contacted with the surface of a substrate. In some embodiments the substrate surface comprises a three-dimensional structure. In some embodiments conditions are selected such that no more than about one monolayer of each precursor is adsorbed on the substrate surface in a self-limiting manner.

Excess precursor or reactant and reaction byproducts, if any, may be removed from the substrate and substrate surface and/or from the proximity to the substrate and substrate surface between pulses of each precursor or reactant. In some embodiments reactant and reaction byproducts, if any, may be removed by purging. Purging may be accomplished for example, with a pulse of inert gas such as nitrogen or argon.

In some embodiments excess precursors (or reactants and/or reaction byproducts, etc.) are removed from the substrate surface or from the area of the substrate by physically moving the substrate from a location containing the precursor, reactant and/or reaction byproducts.

The precursors and reactants employed in the processes may be solid, liquid, or gaseous material under standard conditions (room temperature and atmospheric pressure), provided that they are in vapor phase before they are conducted into the reaction chamber and contacted with the substrate surface.

The steps of contacting the substrate with each precursor and reactant, such as by pulsing, and removing excess precursor or reactant and reaction byproducts are repeated until a thin film of the desired thickness has been formed on the substrate, with each complete cycle typically leaving no more than about a molecular monolayer.

"Pulsing" a vaporized reactant onto the substrate means that the vapor is conducted into the chamber for a limited period of time such that the substrate is exposed to the reactant. Typically, the pulsing time is from about 0.05 seconds to about 60 seconds or even longer. In some embodiments the first reactant comprising a molybdenum precursor is pulsed for about 0.05 to about 10 seconds. In some embodiments other reactants, such as reactants comprising a reducing agent, carbon, nitrogen or hydrogen may be pulsed for about 0.05 to about 60 seconds or longer. However, actual pulsing times can be determined depending on the particular reaction conditions, including substrate type and its surface area.

As an example, for a 300 mm wafer in a single wafer ALD reactor, the molybdenum precursors are typically pulsed for from about 0.05 seconds to about 10 seconds while reducing agents may be pulsed for about 0.05 to about 60 seconds. However, pulsing times can be on the order of minutes in some cases. Again, the optimum pulsing time can be readily determined by the skilled artisan based on the particular circumstances.

The mass flow rate of the reactants can be determined by the skilled artisan. In some embodiments, for example for deposition on 300 mm wafers, the flow rate of the reactants is preferably between about 5 sccm and about 1000 sccm, about 10 sccm to about 800 sccm, or about 50 sccm to about 500 sccm.

The pressure in the reaction chamber is typically from about 1 to 70 Torr, or from about 2 to 40 Torr. However, in some cases the pressure will be higher or lower than this range, as can be readily determined by the skilled artisan depending on multiple parameters, such as the particular reactor being used, the process and the precursors.

As mentioned above, each pulse or phase of each cycle is preferably self-limiting. An excess of reactant is supplied in each phase to saturate the susceptible structure surfaces. Surface saturation ensures reactant occupation of all available reactive sites (subject, for example, to physical size or "steric hindrance" restraints) and thus ensures excellent step coverage. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide near perfect self-limiting behavior and thus maximum conformality, but steric hindrance results in less than one molecular layer per cycle. Limited CVD reactions mixed with the self-limiting ALD reactions can raise the deposition speed.

In some embodiments, a reaction space can be in a single-wafer ALD reactor or a batch ALD reactor where deposition on multiple substrates takes place at the same time. In some embodiments the substrate on which deposition is desired, such as a semiconductor workpiece, is loaded into a reactor. The reactor may be part of a cluster tool in which a variety of different processes in the formation of an integrated circuit are carried out. In some embodiments a flow-type reactor is utilized. In some embodiments a high-volume manufacturing-capable single wafer ALD reactor is used. In other embodiments a batch reactor comprising multiple substrates is used.

Examples of suitable reactors that may be used include commercially available ALD equipment. In addition to ALD reactors, many other kinds of reactors capable of ALD growth of thin films, including CVD reactors equipped with appropriate equipment and means for pulsing the precursors can be employed. In some embodiments a flow type ALD reactor is used. Preferably, reactants are kept separate until reaching the reaction chamber, such that shared lines for the precursors are minimized. However, other arrangements are possible.

In some embodiments batch reactors are utilized. In some embodiments in which a batch reactor is used, wafer-to-wafer uniformity is less than 3% (1sigma), less than 2%, less than 1% or even less than 0.5%.

The deposition processes described herein can optionally be carried out in a reactor or reaction space connected to a cluster tool. In a cluster tool, because each reaction space is dedicated to one type of process, the temperature of the reaction space in each module can be kept constant, which can improve the throughput compared to a reactor in which the substrate is heated up to the process temperature before each run.

In some embodiments, Mo, MoC, $Mo_2C$, MoOC, MoOCN, or MoCN thin films are deposited by a deposition cycle comprising alternately and sequentially contacting a substrate with a first reactant comprising a molybdenum precursor, a second reactant comprising carbon and oxygen, such as a second reactant comprising carbon monoxide (CO), and at least one third reactant comprising hydrogen, such as $H_2$, or ammonia ($NH_3$). In some embodiments the first reactant can be a molybdenum halide. In some embodiments, the first reactant can be a molybdenum oxyhalide. For example, in some embodiments the first reactant may comprise at least one of $MoO_2Cl_2$, $MoCl_5$, $MoOCl_4$, $MoBr_2$, or $MoI_3$. In some embodiments, the first reactant may consist of at least one of $MoO_2Cl_2$, $MoCl_5$, $MoOCl_4$, $MoBr_2$, or $MoI_3$. In some embodiments where Mo is being deposited, the first reactant may be a molybdenum oxyhalide, for example a molybdenum oxychloride such as $MoO_2Cl_2$ or $MoOCl_4$.

In some embodiments where Mo, MoC, MoOC or $Mo_2C$ is being deposited, hydrogen may be used as the reactant comprising hydrogen. In some embodiments where incorporating nitrogen in the deposited material is desired, such as MoOCN, MoCN, a reactant comprising ammonia may be used as the reactant comprising hydrogen.

In some embodiments, a molybdenum precursor comprising oxygen is used and the reactant comprising carbon and oxide can remove oxygen from the molybdenum precursor and contribute carbon to the growing MoC, MoOC, $Mo_2C$ or MoCN thin film. The hydrogen reactant can remove halide ligands, and, in the case of ammonia can both remove halide and contribute nitrogen to the growing MoCN thin films. The deposition cycle is repeated to deposit a film of the desired thickness.

In some embodiments one or more of the reactants (CO, $H_2$ and $NH_3$) may be provided after the molybdenum precursor. In some embodiments, the molybdenum precursor is contacted with the substrate first, followed by the reactant comprising carbon and oxide, and the at least one reactant such as hydrogen or ammonia sequentially. In some embodiments, the molybdenum precursor is contacted with the substrate first, followed by the at least one reactant such as hydrogen or ammonia, and the reactant comprising carbon and oxide sequentially.

For example, in some embodiments, the film deposition cycle (comprises three phases. In a first phase the substrate is contacted with only the first reactant comprising a molybdenum precursor. In a second phase the substrate comprising species of the molybdenum precursor is contacted with a second reactant comprising CO. In a third phase the substrate is contacted with a third reactant comprising hydrogen, such as at least one of an ammonia reactant and a hydrogen reactant. In some embodiments the second and third phases are combined, such that in a first phase the substrate is only contacted with a molybdenum precursor while in a second phase the substrate is contacted with CO, $H_2$ and/or $NH_3$.

In some embodiments the first reactant is provided after at least one of the other reactants. In some embodiments, the substrate is contacted with at least one of the carbon monoxide reactant, the hydrogen reactant, or the ammonia reactant after the first reactant. For example, in some embodiments the carbon monoxide reactant is contacted with the substrate, then the first reactant is contacted with the substrate, and at least one of the hydrogen reactant, or the ammonia reactant can contacted with the substrate. In some embodiments, the at least one of the hydrogen reactant, or the ammonia reactant can contacted with the substrate, then the first reactant is contacted with the substrate, and the carbon monoxide reactant is contacted with the substrate.

The deposition cycle is repeated to deposit a thin film comprising molybdenum and carbon, such an MoC, MoOC, $Mo_2C$, MoOCN or MoCN film of the desired thickness.

In some embodiments, MoC, MoOC, or $Mo_2C$ are deposited by a deposition cycle comprising alternately and sequentially contacting a substrate with a first reactant comprising a molybdenum precursor, a second reactant comprising carbon monoxide, and a third reactant comprising $H_2$. In some embodiments the second reactant comprising carbon monoxide and the third reactant comprising $H_2$ are provided together. That is, in some embodiments the substrate may be separately contacted with the first reactant comprising the molybdenum precursor and simultaneously contacted with the second reactant comprising carbon monoxide and the third reactant comprising $H_2$.

In some embodiments MoOCN, or MoCN thin films are deposited by a deposition cycle comprising alternately and sequentially contacting a substrate with a first reactant comprising molybdenum precursor, a second reactant comprising carbon monoxide, and a third reactant comprising ammonia. In some embodiments the second reactant comprising carbon monoxide and the third reactant comprising ammonia are provided together. That is, in some embodiments the substrate may be separately contacted with the first reactant comprising the molybdenum precursor and simultaneously contacted with the second reactant comprising carbon monoxide and the third reactant comprising ammonia. In some embodiments an additional reactant comprising $H_2$ is included in one or more deposition cycles. Thus, in some embodiments MoOCN or MoCN thin films are deposited using at least one deposition cycle comprising alternately and sequentially contacting a substrate with the first reactant comprising the molybdenum precursor, the second reactant comprising carbon monoxide, the third reactant comprising ammonia and the reactant fourth comprising $H_2$. In some embodiments two or more of the reactants comprising carbon monoxide, ammonia and $H_2$ may be provided together. For example, the substrate may be alternately and sequentially contacted with the first reactant comprising the molybdenum precursor, the second reactant comprising CO and a reactant comprising both $H_2$ and $NH_3$. The deposition cycle is repeated to deposit a film of the desired thickness. In some embodiments for depositing MoOC or MoOCN, the molybdenum precursor is a molybdenum oxyhalide and the ratio of the additional reactants is tuned to deposit the desired material.

In some embodiments the order of provision of the reactant may be varied. For example, in some embodiments in a deposition cycle each of the reactants (CO, $H_2$ and/or $NH_3$) may be provided after the first reactant comprising the molybdenum precursor. For example, one of the carbon monoxide reactant, the hydrogen reactant and/or the ammonia reactant contacts the substrate after the molybdenum precursor and reacts with adsorbed species of the molybdenum precursor. In some embodiments one or more of the reactants may be provided before the molybdenum precursor in the deposition cycle. In that case, the reactant or reactants provided before the molybdenum precursor will react with adsorbed molybdenum species in the subsequent deposition cycle. In some embodiments, the order of the additional reactants does not matter. In some embodiments, the carbon monoxide reactant is provided before an $H_2$ or $NH_3$ reactant. In other embodiments an $H_2$ or $NH_3$ reactant is provided prior to the carbon monoxide reactant.

In some embodiments, at least one deposition cycle may comprise another treatment phase in which the substrate is separately contacted with a vapor phase reactant comprising oxygen, such as $H_2O$, $O_3$, $H_2O_2$, $N_2O$, $NO_2$ or NO. This may be called an oxidation phase. In some embodiment, the oxidation phase may be performed after contacting the substrate with the first reactant comprising the molybdenum precursor. In some embodiments, the oxidation phase may be conducted last in the deposition cycle. For example, a deposition cycle may comprise contacting the substrate with a first reactant comprising a molybdenum precursor, contacting the substrate with a second reactant comprising CO, contacting the substrate with a third reactant comprising $H_2$ and/or $NH_3$, and contacting the substrate with a reactant comprising oxygen. In some embodiments an oxidation phase is included in one deposition cycle. In some embodiments an oxidation phase is included in multiple deposition cycles, or in each deposition cycle. In some embodiments an oxidation phase is included at intervals in the deposition process.

Figure 2:
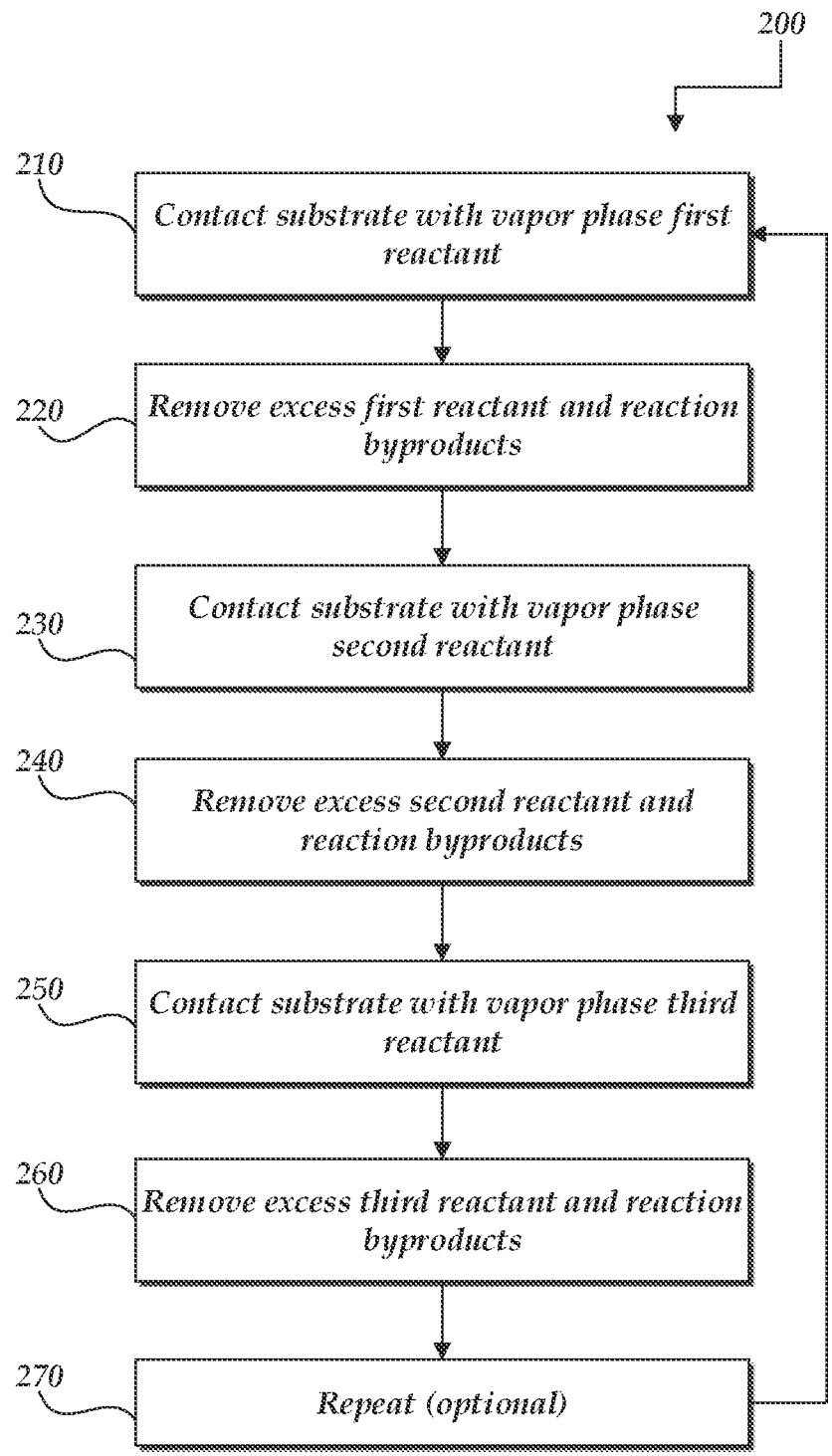
FIG. 2 is a flow chart illustrating processes for depositing metallic films comprising molybdenum and carbon by atomic layer deposition (ALD) deposition according to certain embodiments.

FIG. 2 is a flow-chart illustrating a deposition process 200 for depositing a thin film comprising molybdenum according to some embodiments. Referring to FIG. 2, the thin film comprising molybdenum is deposited on a substrate in a reaction space by the deposition process 200. The deposition process 200 comprises at least one deposition cycle comprising contacting the surface of the substrate with a first reactant comprising a vapor phase molybdenum precursor at block 210, removing excess molybdenum precursor and reaction byproducts, if any, from the surface at block 220, contacting the surface of the substrate with a vapor phase second reactant at block 230, removing any excess second reactant and reaction byproducts, if any, from the surface of the substrate at block 240, contacting the surface of the substrate with a vapor phase third reactant at block 250, and removing any excess third reactant and reaction byproducts, if any, from the surface of the substrate at block 260. The contacting and removing steps 210-260 can optionally be repeated at block 270 form the thin film comprising molybdenum of a desired thickness. For example, Mo, MoC, $Mo_2C$, MoOC, MoOCN, or MoCN thin films can be deposited.

In some embodiments, the molybdenum precursor may comprise a molybdenum halide, as discussed above. In some embodiments the molybdenum precursor may comprise a molybdenum oxyhalide. For example, the molybdenum precursor may comprise at least one of $MoO_2Cl_2$, $MoCl_5$, $MoOCl_4$, $MoBr_2$, or $MoI_3$. In some embodiments, the precursors may consist of at least one of $MoO_2Cl_2$, $MoCl_5$, $MoOCl_4$, $MoBr_2$, or $MoI_3$.

In some embodiments, the second reactant may comprise a first reducing agent. In some embodiments the second reactant comprises carbon and oxygen, such as carbon monoxide (CO). In some embodiments, the second reactant may consist of carbon monoxide (CO).

In some embodiments, the third reactant may comprise a nitrogen reactant, such as ammonia ($NH_3$). In some embodiments, the third reactant may consist of ammonia ($NH_3$).

In some embodiments, the third reactant may comprise a second reducing agent. In some embodiments the third reactant may comprise hydrogen, such as $H_2$. In some embodiments, the third reactant may consist of hydrogen, such as $H_2$.

In some embodiments, a Mo, MoC, MoOC or $Mo_2C$ film may be deposited by the process illustrated in FIG. 2. In some embodiment, the molybdenum precursor comprises a molybdenum halide, such as $MoOCl_4$ or $MoO_2Cl_2$, the second reactant comprises CO, and the third reactant comprises $H_2$. In some embodiment, the second reactant comprises $H_2$, and the third reactant comprises CO. The deposition of MoC, MoOC or $Mo_2C$ may be controlled, for example by tuning a ratio of the second reactant and the third reactant in the overall deposition process. That is, in some deposition cycles the second or third reactant may be omitted to adjust the ratio of times the substrate is contacted with the second and third reactants in the total deposition process.

In some embodiments the only reactants used in the deposition cycle are the molybdenum precursor, CO and $H_2$.

In some embodiments, a MoCN thin film may be deposited. In some embodiment, the molybdenum precursor comprises a molybdenum halide, such as $MoOCl_4$ or $MoO_2Cl_2$, the second reactant comprises CO, and the third reactant comprises $NH_3$. In some embodiments the second reactant comprises $NH_3$, and the third reactant comprises CO.

In some embodiments the only reactants used in the deposition cycle are the molybdenum precursor, CO and $NH_3$.

In some embodiments the above described cyclical deposition process 200 may be an ALD type process. In some embodiments the cyclical deposition process 200 may be an ALD process. In some embodiments the above-described cyclical process 200 may be a hybrid ALD/CVD or cyclical CVD process.

Although the illustrated deposition cycle begins with contacting the surface of the substrate with the first reactant comprising vapor phase molybdenum precursor 210, in other embodiments the deposition cycle may begin with contacting the surface of the substrate with the second reactant 230 or the third reactant 250.

In some embodiments removing the precursors or reactant and any excess reaction byproducts at blocks 220, 240, 260 may comprise purging the reaction space or reaction chamber. Purging the reaction chamber may comprise the use of a purge gas and/or the application of a vacuum to the reaction space. Where a purge gas is used, the purge gas may flow continuously or may be flowed through the reaction space only after the flow of a reactant gas has been stopped and before the next reactant gas begins flowing through the reaction space. It is also possible to continuously flow a purge or non-reactive gas through the reaction chamber so as to utilize the non-reactive gas as a carrier gas for the various reactive species. Thus, in some embodiments, a gas, such as nitrogen, continuously flows through the reaction space while the molybdenum precursor and reactant are pulsed as necessary into the reaction chamber. Because the carrier gas is continuously flowing, removing excess reactant or reaction by-products is achieved by merely stopping the flow of reactant gas into the reaction space.

In some embodiments removing the precursors or reactant and any excess reaction byproducts at blocks 220, 240, 260 may comprise moving the substrate from a first reaction chamber to a second, different reaction chamber. In some embodiments removing the precursors or reactant and any excess reaction byproducts at blocks 220, 240, 260 may comprise moving the substrate from a first reaction chamber to a second, different reaction chamber under a vacuum.

In some embodiments the deposited thin film comprising molybdenum may be subjected to a treatment process after deposition. In some embodiments this treatment process may, for example, enhance the conductivity or continuity of the deposited thin film comprising molybdenum. In some embodiments a treatment process may comprise, for example an anneal process.

Figure 3:
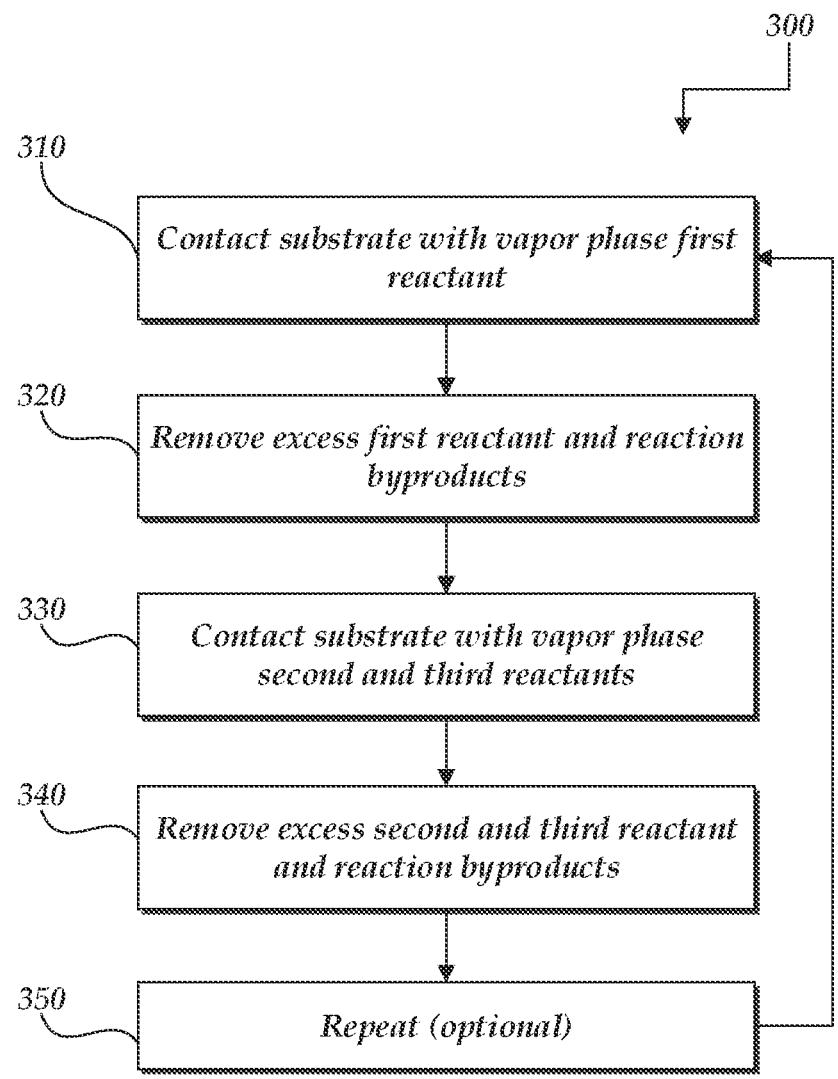
FIG. 3 is a flow chart illustrating processes for depositing metallic films comprising molybdenum and carbon by atomic layer deposition (ALD) deposition according to certain embodiments.

FIG. 3 is a flow-chart illustrating a deposition process 300 for depositing a thin film comprising molybdenum according to some embodiments. The deposition process 300 is similar to the deposition process 200 except that the second reactant and the third reactant are contacted with the substrate at the same time, such as by being co-flowed into the reaction space together. The deposition process 300 comprises at least one deposition cycle comprising contacting the surface of the substrate with a first reactant comprising a vapor phase molybdenum precursor at block 310, removing any excess molybdenum precursor and reaction byproducts, if any, from the surface at block 320, simultaneously contacting the surface of the substrate with a vapor phase second reactant and a vapor phase third reactant at block 330, and removing excess second and third reactants and reaction byproducts, if any, from the surface of the substrate at block 340. The deposition cycle comprising the contacting and removing steps 310-340 can be repeated at block 350 to form the thin film comprising molybdenum of a desired thickness. For example, Mo, MoC, $Mo_2C$, MoOC, MoOCN, or MoCN thin films can be deposited.

As indicated in FIG. 3, in some embodiments the molybdenum precursor comprises a molybdenum oxychloride. However, other molybdenum precursors may be used. In some embodiments the molybdenum precursor may comprise a molybdenum halide, such as a molybdenum oxyhalide. For example, the molybdenum precursor may comprise at least one of $MoO_2Cl_2$, $MoCl_5$, $MoOCl_4$, $MoBr_2$, or $MoI_3$. For example, the precursors may consist of at least one of $MoO_2Cl_2$, $MoCl_5$, $MoOCl_4$, $MoBr_2$, or $MoI_3$.

In some embodiments, the second reactant may comprise a first reducing agent. In some embodiments the second reactant comprises carbon. In some embodiments the second reactant comprises carbon and oxygen, such as carbon monoxide (CO). In some embodiments, the third reactant may comprise nitrogen, such as ammonia ($NH_3$). In some embodiments, the third reactant may comprise a second reducing agent. In some embodiments the third reactant may comprise hydrogen, such as $H_2$. In some embodiments the second reactant may comprise CO and the third reactant may comprise $NH_3$. In some embodiments the second reactant may comprise CO and the third reactant may comprise $H_2$. In some embodiments the second reactant may comprise CO and the third reactant may comprise both $NH_3$ and $H_2$.

Accordingly, in some embodiments, the second reactant and the third reactant may comprise CO, and $H_2$ and they may be flowed into the reaction space together. In some embodiments, the second reactant and the third reactant may comprise CO, and $NH_3$ and they may be flowed into the reaction space together. In some embodiments, the molybdenum precursor, and/or one or more of the reactants may be supplied with a carrier gas. In some embodiments, a co-flow of the second reactant and the third reactant may consist of CO, and $H_2$. In some embodiments, a co-flow of the second reactant and the third reactant may consist of CO, and $NH_3$.

In some embodiments, a MoC or $Mo_2C$ film may be deposited. In some embodiment, the molybdenum precursor may comprise $MoOCl_4$ or $MoO_2Cl_2$, and the co-flow of the second reactant and the third reactant may comprise CO and $H_2$. The deposition of MoC, MoOC or $Mo_2C$ may be controlled by tuning a ratio of the second reactant and the third reactant.

In some embodiments, a MoOCN, or MoCN film may be deposited. In some embodiment, the molybdenum precursor comprises $MoOCl_4$ or $MoO_2Cl_2$, and the co-flow of the second reactant and the third reactant may comprise CO and $NH_3$. In some embodiments the third reactant comprises $NH_3$ and $H_2$, such that CO, $NH_3$ and $H_2$ are flowed together.

Figure 4:
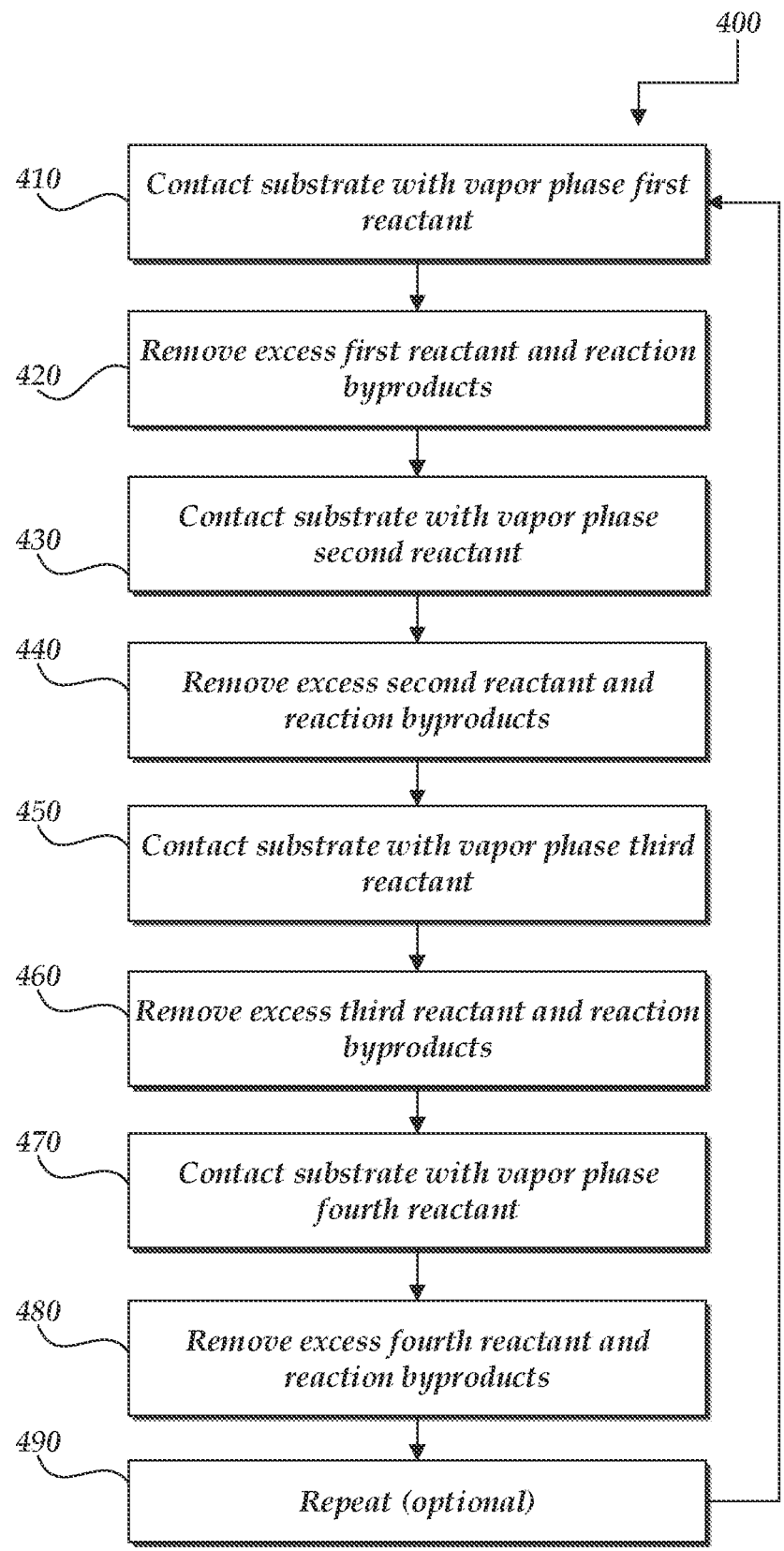
FIG. 4 is a flow chart illustrating processes for depositing metallic films comprising molybdenum and carbon by atomic layer deposition (ALD) deposition according to certain embodiments.

FIG. 4 is a flow-chart illustrating a deposition process 400 for depositing a thin film comprising molybdenum according to some embodiments. The deposition process 400 is similar to the deposition process 200 except that an additional fourth reactant is further used. The deposition process 400 comprises at least one deposition cycle comprising contacting the surface of the substrate with a first reactant comprising a vapor phase molybdenum precursor at block 410, removing any excess molybdenum precursor and reaction byproducts, if any, from the surface at block 420, contacting the surface of the substrate with a vapor phase second reactant at block 430, removing any excess second reactant and reaction byproducts, if any, from the surface of the substrate at block 440, contacting the surface of the substrate with a vapor phase third reactant at block 450, removing any excess third reactant and reaction byproducts, if any, from the surface of the substrate at block 460, contacting the surface of the substrate with a vapor phase fourth reactant at block 470, and removing any excess fourth reactant and reaction byproducts, if any, from the surface of the substrate at block 480. The contacting and removing steps can be repeated at block 490 to form the thin film comprising molybdenum of a desired thickness. For example, MoOCN or MoCN thin films can be deposited.

In some embodiments, the molybdenum precursor may comprise molybdenum halide or molybdenum oxyhalide. For example, the molybdenum precursor may comprise at least one of $MoO_2Cl_2$, $MoCl_5$, $MoOCl_4$, $MoBr_2$, or $MoI_3$.

In some embodiments, the second reactant may comprise a first reducing agent. In some embodiments, the second reactant may comprise carbon. In some embodiments the second reactant may comprise carbon and oxygen, such as carbon monoxide (CO), the third reactant may comprise nitrogen, such as ammonia ($NH_3$), and the fourth reactant may comprise a second reducing agent, such as hydrogen ($H_2$). In some embodiments, the second reactant may consist of carbon monoxide (CO), the third reactant may consist of ammonia ($NH_3$), and the fourth reactant may consist of hydrogen ($H_2$).

In some embodiments, the second reactant may comprise carbon and oxygen, such as carbon monoxide (CO), the third reactant may comprise hydrogen ($H_2$), and the fourth reactant may comprise nitrogen, such as ammonia ($NH_3$). In some embodiments, the second reactant may consist of carbon and oxygen, such as carbon monoxide (CO), the third reactant may consist of hydrogen ($H_2$), and the fourth reactant may consist of ammonia ($NH_3$).

In some embodiments, the second reactant may comprise hydrogen ($H_2$), the third reactant may comprise carbon and oxygen, such as carbon monoxide (CO), and the fourth reactant may comprise nitrogen, such as ammonia ($NH_3$). In some embodiments, the second reactant may consist of hydrogen ($H_2$), the third reactant may consist of carbon and oxygen, such as carbon monoxide (CO), and the fourth reactant may consist of nitrogen, such as ammonia ($NH_3$).

In some embodiments, the second reactant may comprise hydrogen ($H_2$), the third reactant may comprise nitrogen, such as ammonia ($NH_3$), and the fourth reactant may comprise carbon and oxygen, such as carbon monoxide (CO). In some embodiments, the second reactant may consist of hydrogen ($H_2$), the third reactant may consist of nitrogen, such as ammonia ($NH_3$), and the fourth reactant may consist of carbon and oxygen, such as carbon monoxide (CO).

In some embodiments, the second reactant may comprise nitrogen, such as ammonia ($NH_3$), the third reactant may comprise carbon and oxygen, such as carbon monoxide (CO), and the fourth reactant may comprise hydrogen ($H_2$). In some embodiments, the second reactant may consist of nitrogen, such as ammonia ($NH_3$), the third reactant may consist of carbon and oxygen, such as carbon monoxide (CO), and the fourth reactant may consist of hydrogen ($H_2$).

In some embodiments, the second reactant may comprise nitrogen, such as ammonia ($NH_3$), the third reactant may comprise hydrogen ($H_2$), and the fourth reactant may comprise carbon and oxygen, such as carbon monoxide (CO). In some embodiments, the second reactant may consist of nitrogen, such as ammonia ($NH_3$), the third reactant may consist of hydrogen ($H_2$), and the fourth reactant may consist of carbon and oxygen, such as carbon monoxide (CO).

In some embodiments, $H_2$ may be co-flowed with $NH_3$ in any of the deposition processes, for example at steps 200, 300, or 400 in FIGS. 2, 3 and 4 respectively.

In some embodiments, an oxidization process can be performed, for example prior to block 230. For example, in an oxidation process $H_2O$, $O_3$, $H_2O_2$, $N_2O$, $NO_2$ or NO may be contacted with the substrate. For example, a molybdenum precursor comprising $MoOCl_4$ can be dissociated in an oxidation step to form $MoO_2$ and release HCl gas and $O_2$. After the oxidation process, $MoO_2$ may be reduced to form Mo film using the second and/or the third reactant, i.e., CO and $H_2$ and/or $NH_3$. In some embodiments, the oxidation process can comprise co-flowing $H_2O$ and $H_2$.

Thin Film Characteristics

Thin films deposited according to some of the embodiments described herein may be continuous thin films comprising molybdenum. In some embodiments the thin films comprising molybdenum may be continuous at a thickness below about 100 nm, below about 60 nm, below about 50 nm, below about 40 nm, below about 30 nm, below about 25 nm, or below about 20 nm or below about 15 nm or below about 10 nm or below about 5 nm or lower. The continuity referred to can be physically continuity or electrical continuity. In some embodiments, the thickness at which a film may be physically continuous may not be the same as the thickness at which a film is electrically continuous, and the thickness at which a film may be electrically continuous may not be the same as the thickness at which a film is physically continuous.

While in some embodiments a thin film comprising molybdenum deposited according to some of the embodiments described herein may be continuous, in some embodiments it may be desirable to form a non-continuous thin film comprising molybdenum, or a thin film comprising separate islands or nanoparticles comprising molybdenum. In some embodiments the deposited thin film comprising molybdenum may comprise nanoparticles comprising molybdenum that are not substantially physically or electrically continuous with one another. In some embodiments the deposited thin film comprising molybdenum may comprise separate nanoparticles, or separate islands, comprising molybdenum.

In some embodiments a thin film comprising molybdenum deposited according to some of the embodiments described herein may have a resistivity of less than about 20 μΩcm at a thickness of less than about 100 nm. In some embodiments a thin film comprising molybdenum deposited according to some of the embodiments described herein may have a resistivity of less than about 20 μΩcm at a thickness of below about 60 nm, below about 50 nm, below about 40 nm, below about 30 nm, below about 25 nm, or below about 20 nm or lower. In some embodiments a thin film comprising molybdenum deposited according to some of the embodiments described herein may have a resistivity of less than about 15 μΩcm at a thickness of below about 60 nm, below about 50 nm, below about 40 nm, below about 30 nm, below about 25 nm, or below about 20 nm or lower. In some embodiments a thin film comprising molybdenum deposited according to some of the embodiments described herein may have a resistivity of less than about 10 μΩcm at a thickness of below about 60 nm, below about 50 nm, below about 40 nm, below about 30 nm, below about 25 nm, or below about 20 nm or lower. In some embodiments a thin film comprising molybdenum deposited according to some of the embodiments described herein may have a resistivity of less than about 200 μΩcm at a thickness of below about 30 nm, below about 20 nm, below about 15 nm, below about 10 nm, below about 8 nm, or below about 5 nm or lower.

In some embodiments a thin film comprising molybdenum deposited according to some of the embodiments described herein may have a resistivity of less than about 200 μΩcm, less than about 100 μΩcm, less than about 50 μΩcm, less than about 30 μΩcm, less than about 20 μΩcm, less than about 18 μΩcm, less than about 15 μΩcm, less than about 12 μΩcm, less than about 10 μΩcm, less than about 8 μΩcm, or less than about 5 μΩcm or lower at a thickness of less than about 100 nm. In some embodiments a thin film comprising molybdenum deposited according to some of the embodiments described herein may have a resistivity of less than about 20 μΩcm, less than about 18 μΩcm, less than about 15 μΩcm, less than about 12 μΩcm, less than about 10 μΩcm, less than about 8 μΩcm, or less than about 5 μΩcm or lower at a thickness of less than about 50 nm.

In some embodiments an MoC, $Mo_2C$, MoOC, MoOCN, or MoCN film is deposited to a thickness of less than about 10 nm, more preferably less than about 5 nm and most preferably less than about 3 nm.

Atomic layer deposition allows for conformal deposition of Mo, MoC, $Mo_2C$, MoOC, MoOCN, or MoCN films. In some embodiments, the Mo, MoC, $Mo_2C$ or MoCN films deposited by the processes disclosed herein on a three-dimensional structure have at least 90%, 95% or higher conformality. In some embodiments the films are about 100% conformal.

In some embodiments, the Mo, MoC, $Mo_2C$, MoOC, MoOCN, or MoCN film formed has step coverage of more than about 80%, more preferably more than about 90%, and most preferably more than about 95% in structures which have high aspect ratios. In some embodiments high aspect ratio structures have an aspect ratio that is more than about 3:1 when comparing the depth or height to the width of the feature. In some embodiments the structures have an aspect ratio of more than about 5:1, or even an aspect ratio of 10:1 or greater.

In some embodiments, the molybdenum films, such as Mo, MoC, $Mo_2C$, MoOC, MoOCN, or MoCN films deposited by processes disclosed herein are treated after the deposition, such as by annealing, as desired depending on the application. In some embodiments the Mo, MoC, $Mo_2C$, MoOC, MoOCN, or MoCN films are annealed in an oxygen environment. For example, the films may be annealed at an elevated temperature in water or $O_2$. In some embodiments an annealing step is not carried out.

In some embodiments, following deposition of the molybdenum films, such as Mo, MoC, $Mo_2C$ or MoCN deposition, a further film is deposited. In some embodiments the additional film may be directly over and contacting the molybdenum film, such as directly over and contacting a Mo, MoC, $Mo_2C$, MoOC, MoOCN, or MoCN layer.

Although certain embodiments and examples have been discussed, it will be understood by those skilled in the art that the scope of the claims extend beyond the specifically disclosed embodiments to other alternative embodiments and/or uses and obvious modifications and equivalents thereof.

What is claimed is:

1. A process for forming a thin film comprising molybdenum and carbon on a substrate in a reaction space, the process comprising a deposition cycle comprising:
   contacting the substrate with a first reactant comprising a vapor phase molybdenum precursor comprising a molybdenum halide and subsequently contacting the substrate simultaneously with a second reactant comprising CO and a third reactant comprising $H_2$,
   wherein the deposition cycle is repeated two or more times to form the thin film comprising molybdenum and carbon, wherein the thin film consists essentially of one or more of MoC, $Mo_2C$, MOOC, MoOCN, or MoCN.

2. The process of claim 1, further comprising depositing a cobalt-containing film on the thin film comprising molybdenum and carbon, wherein the thin film comprising molybdenum and carbon has a thickness less than 10 nm.

3. The process of claim 1, further comprising depositing a cobalt-containing film on the thin film comprising molybdenum and carbon, wherein the thin film comprising molybdenum and carbon has a thickness less than 5 nm.

4. The process of claim 1, wherein the thin film consists essentially of $Mo_2C$.

5. The process of claim 1, wherein the deposition cycle further comprises removing excess vapor phase molybdenum precursor and reaction byproducts, if any, from the reaction space after contacting the substrate with the first reactant and prior to contacting the substrate with the second and the third reactants.

6. The process of claim 1, wherein the molybdenum precursor comprises a compound selected from the group consisting of $MoCl_5$, $MoBr_2$, or $MoI_3$.

7. The process of claim 1, wherein the molybdenum precursor comprises a molybdenum oxyhalide.

8. The process of claim 7, wherein the molybdenum precursor comprises at a compound selected from the group consisting of $MoOCl_4$, or $MoO_2Cl_2$.

9. The process of claim 1, wherein the thin film comprising molybdenum and carbon consists of one or more of MoC, $Mo_2C$, MoOC, MoOCN, or MoCN.

10. The process of claim 1, wherein the thin film comprising molybdenum and carbon consists essentially of one of MoC, $Mo_2C$, and MOOC.

11. The process of claim 1, wherein the deposition cycle further comprises contacting the substrate with a fourth reactant comprising $NH_3$.

12. The process of claim 1, wherein the thin film comprising molybdenum consists essentially of one or more of MoOCN or MoCN.

13. The process of claim 1, wherein the only reactants that are used in the deposition cycle are the molybdenum precursor, CO and $H_2$.

14. The process of claim 1, further comprising contacting the substrate with an oxygen reactant, wherein the oxygen reactant comprises at least one of $H_2O$, $H_2O_2$, $NO_2$ or NO.

15. The process of claim 1, wherein the thin film comprising molybdenum and carbon consists of one or more of MoOCN or MoCN.

16. The process of claim 1, wherein the deposition cycle comprises, in order:
   contacting the substrate with the first reactant comprising the vapor phase molybdenum precursor;
   contacting the substrate with the second reactant comprising CO and contacting the substrate with the third reactant comprising $H_2$.

17. The process of claim 1, wherein the third reactant further comprises $NH_3$.

18. The process of claim 1, further comprising depositing a cobalt-containing film on the thin film comprising molybdenum and carbon.

19. The process of claim 1, wherein the deposition cycle comprises, in order:
   contacting the substrate with the first reactant comprising the vapor phase molybdenum precursor; and
   contacting the substrate simultaneously with the second reactant and the third reactant.

20. The process of claim 1, wherein the process is an atomic layer deposition process.

21. A vapor deposition process for forming a thin film comprising molybdenum carbon nitride on a substrate in a reaction space, the vapor deposition process comprising a deposition cycle comprising:
   contacting the substrate with a first reactant comprising a vapor phase molybdenum halide; and
   subsequently contacting the substrate with a second reactant comprising CO and a third reactant comprising $H_2$ and $NH_3$, and
   repeating the deposition cycle to form a thin film comprising molybdenum carbon nitride.

22. The vapor deposition process of claim 21, wherein the deposition cycle further comprises removing excess first reactant and reaction byproducts, if any, from the reaction space after contacting the substrate with the first reactant and prior to contacting the substrate with the second reactant or third reactant.

23. The vapor deposition process of claim 21, wherein the molybdenum halide comprises a compound selected from the group consisting of $MoCl_5$, $MoBr_2$, $MoI_3$, $MoOCl_4$, or $MoO_2Cl_2$.

24. The vapor deposition process of claim 21, wherein the only reactants that are used in the deposition cycle are the molybdenum halide, CO, $NH_3$ and $H_2$.

* * * * *